(12) United States Patent
Bruland et al.

(10) Patent No.: US 8,238,007 B2
(45) Date of Patent: *Aug. 7, 2012

(54) ON-THE-FLY LASER BEAM PATH ERROR CORRECTION FOR SPECIMEN TARGET LOCATION PROCESSING

(75) Inventors: Kelly Bruland, Portland, OR (US);
Mark Unrath, Portland, OR (US);
Stephen Swaringen, Rockwall, TX (US); Ho Wai Lo, Portland, OR (US);
Clint Vandergiessen, Beaverton, OR (US); Keith Grant, Aloha, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1514 days.

This patent is subject to a terminal disclaimer.

(21) Appl. No.: 11/616,070

(22) Filed: Dec. 26, 2006

(65) Prior Publication Data

US 2008/0017618 A1  Jan. 24, 2008

Related U.S. Application Data

(63) Continuation of application No. 10/985,840, filed on Nov. 9, 2004, now Pat. No. 7,245,412, which is a continuation-in-part of application No. 10/077,691, filed on Feb. 15, 2002, now Pat. No. 6,816,294.

(60) Provisional application No. 60/269,646, filed on Feb. 16, 2001.

(51) Int. Cl.
*G02B 26/08* (2006.01)
*B23K 26/08* (2006.01)

(52) U.S. Cl. ............... 359/198.1; 359/199.1; 359/201.2; 359/202.1; 359/215.1; 359/225.1; 359/226.1; 359/900; 219/121.78; 219/121.8; 219/121.82

(58) Field of Classification Search .... 359/196.1–226.2; 219/121.64–121.75, 212.77, 121.78, 121.8–121.82
See application file for complete search history.

(56) References Cited

U.S. PATENT DOCUMENTS

| 3,432,671 A | 3/1969 | Edmunds |
| 4,001,840 A | 1/1977 | Becker et al. |
| 4,532,402 A | 7/1985 | Overbeck |
| 4,544,889 A | 10/1985 | Hendriks et al. |

(Continued)

FOREIGN PATENT DOCUMENTS

JP  55-081095  6/1980

(Continued)

OTHER PUBLICATIONS

First Office action in CN 200710091523.1 dated Jul. 10, 2009, pp. 1-3.

(Continued)

*Primary Examiner* — James Phan
(74) *Attorney, Agent, or Firm* — Stoel Rives LLP

(57) ABSTRACT

A laser-based workpiece processing system includes sensors connected to a sensor controller that converts sensor signals into focused spot motion commands for actuating a beam steering device, such as a two-axis steering mirror. The sensors may include a beam position sensor for correcting errors detected in the optical path, such as thermally-induced beam wandering in response to laser or acousto-optic modulator pointing stability, or optical mount dynamics.

25 Claims, 13 Drawing Sheets

U.S. PATENT DOCUMENTS

| | | | |
|---|---|---|---|
| 4,685,775 | A | 8/1987 | Goodman et al. |
| 4,941,082 | A | 7/1990 | Pailthorp et al. |
| 4,980,882 | A | 12/1990 | Baer et al. |
| 5,074,628 | A | 12/1991 | Khattak et al. |
| 5,121,245 | A | 6/1992 | Johnson |
| 5,126,648 | A | 6/1992 | Jacobs |
| 5,223,692 | A | 6/1993 | Lozier et al. |
| 5,262,707 | A | 11/1993 | Okazaki et al. |
| 5,280,378 | A | 1/1994 | Lombardo |
| 5,295,014 | A | 3/1994 | Toda |
| 5,382,770 | A | 1/1995 | Black et al. |
| 5,449,882 | A | 9/1995 | Black et al. |
| 5,452,275 | A | 9/1995 | Ogawa |
| 5,484,982 | A | 1/1996 | Nihei et al. |
| 5,526,165 | A | 6/1996 | Toda et al. |
| 5,536,916 | A | 7/1996 | Kohari et al. |
| 5,571,430 | A | 11/1996 | Kawasaki et al. |
| 5,629,790 | A | 5/1997 | Neukermans et al. |
| 5,653,900 | A | 8/1997 | Clement et al. |
| 5,666,202 | A | 9/1997 | Kyrazis |
| 5,673,110 | A | 9/1997 | Erickson et al. |
| 5,744,780 | A | 4/1998 | Chang et al. |
| 5,751,585 | A | 5/1998 | Cutler et al. |
| 5,798,927 | A | 8/1998 | Cutler et al. |
| 5,837,962 | A | 11/1998 | Overbeck |
| 5,847,960 | A | 12/1998 | Cutler et al. |
| 5,940,789 | A | 8/1999 | Yuan |
| 5,946,152 | A | 8/1999 | Baker |
| 6,087,625 | A | 7/2000 | Iso |
| 6,088,107 | A | 7/2000 | Livingston |
| 6,144,118 | A | 11/2000 | Cahill et al. |
| 6,462,306 | B1 | 10/2002 | Kitai et al. |
| 6,479,788 | B1 | 11/2002 | Arai et al. |
| 6,521,866 | B1 | 2/2003 | Arai et al. |
| 6,555,781 | B2 | 4/2003 | Ngoi et al. |
| 6,662,063 | B2 | 12/2003 | Hunter et al. |
| 6,706,999 | B1 | 3/2004 | Barrett et al. |
| 6,720,519 | B2 | 4/2004 | Lui et al. |
| 6,794,660 | B2 | 9/2004 | Watson |
| 6,816,294 | B2 | 11/2004 | Unrath et al. |
| 6,838,639 | B2 | 1/2005 | Kreuter et al. |
| 6,849,824 | B2 | 2/2005 | Arai et al. |
| 6,875,951 | B2 | 4/2005 | Sakamoto et al. |
| 6,909,735 | B2 | 6/2005 | Lizotte et al. |
| 6,984,802 | B2 | 1/2006 | Kuroiwa et al. |
| 7,027,199 | B2 | 4/2006 | Johnson |
| 7,129,601 | B2 | 10/2006 | Brown et al. |
| 7,245,412 | B2 * | 7/2007 | Bruland et al. ............ 359/225.1 |
| 2002/0167581 | A1 | 11/2002 | Cordingley |
| 2005/0279736 | A1 | 12/2005 | Bruland et al. |
| 2005/0281101 | A1 | 12/2005 | Bruland et al. |

FOREIGN PATENT DOCUMENTS

| | | |
|---|---|---|
| JP | 56-143434 | 11/1981 |
| JP | 63-302503 | 12/1988 |
| JP | 64-044295 | 2/1989 |
| JP | 1989-224189 | 8/1989 |
| JP | 1989-1289592 | 11/1989 |
| JP | 1990-2192885 | 7/1990 |
| JP | 03-297588 | 12/1991 |
| JP | 1996-8118057 | 5/1996 |
| JP | 10-328873 | 12/1998 |
| JP | 11-019786 | 1/1999 |
| JP | 11-104863 | 4/1999 |
| JP | 11-104871 | 4/1999 |
| JP | 11-245073 | 9/1999 |
| JP | 11-245080 | 9/1999 |
| JP | 11-267873 | 10/1999 |
| JP | 1999-11267873 | 10/1999 |
| JP | 2000-190087 | 7/2000 |
| JP | 2000-321528 | 11/2000 |
| JP | 2001-121279 | 5/2001 |
| JP | 2001-170788 | 6/2001 |
| JP | 2001-269790 | 10/2001 |
| JP | 2002-011588 | 1/2002 |
| JP | 2002-361464 | 12/2002 |
| JP | 2003-053561 | 2/2003 |
| JP | 2003-053575 | 2/2003 |
| JP | 2003-053576 | 2/2003 |
| JP | 2005-177788 | 7/2005 |

OTHER PUBLICATIONS

Office action dated Sep. 7, 2010 issued by the Japanese Patent Office for corresponding Japanese Patent Application No. 2007-114,770.

U.S. Appl. No. 11/925,562, filed Oct. 26, 2007, Bruland et al.

"Precision Fast Steering Mirrors," Ball Aerospace & Technologies Corp., Bolder, CO, ©1999, pp. 1-3.

"S-330 QxQy Ultra-Fast Piezo Tip/Tilt Platforms," Physik Instrumente (PI) GmbH & Co., Karlsruhe, Germany, printed Feb. 5, 2002 from www.physikinstrumente.com/pztactiveoptics/3_10.html, pp. 1-5.

"Fast Steering Mirrors", Newport Corporation, Irvine, California, Jan. 2001, 4 pages.

"Fast Steering Mirror Technology: Active Beam Stabilization", Phillip V. Mitchell, Newport Corporation, Irvine, California, Jan. 2001, 6 pages.

English translation of Paragraphs 0013-0028 and drawing captions of JP 2000-321528 (Nov. 24, 2000) "Document 3" (DA).

English translation of Paragraphs 0001-0031, 0054, and 0057 and brief description of drawings of JP 1999-11267873 (Oct. 5, 1999) "Document 2" (DB).

English translation of Paragraphs 0035-0038 and drawing captions of JP 1996-8118057 (May 14, 1996) "Document 4" (DC).

English translation of JP 1989-1289592 (without claims) (Nov. 21, 1989) "Document 1" (DE).

Office action dated Apr. 14, 2010 issued by the Japanese Patent Office for corresponding Japanese Patent Application No. 2007-114,770.

Office action dated Apr. 19, 2011 issued by the Japanese Patent Office for corresponding Japanese Patent Application No. 2007-114,770.

Office action dated Oct. 27, 2011 issued by the Chinese Patent Office for corresponding Chinese Patent Application No. 2007-10091523.1.

Office action dated Aug. 1, 2011 issued by the USPTO for related U.S. Appl. No. 11/925,562.

* cited by examiner

ON-THE-FLY LASER BEAM PATH ERROR CORRECTION FOR SPECIMEN TARGET LOCATION PROCESSING

RELATED APPLICATIONS

This is a continuation of U.S. patent application Ser. No. 10/985,840, filed Nov. 9, 2004, now U.S. Pat. No. 7,245,412, which is a continuation-in-part of U.S. patent application Ser. No. 10/077,691, filed Feb. 15, 2002, now U.S. Pat. No. 6,816,294, which claims benefit of U.S. Provisional Patent Application No. 60/269,646, filed Feb. 16, 2001.

TECHNICAL FIELD

This invention relates to laser processing of integrated circuit ("IC") links and, in particular, to a laser system and method employing a laser beam and substrate positioning system that incorporates a steering mirror to compensate for stage positioning errors and enhance link severing throughput.

BACKGROUND OF THE INVENTION

Yields in IC device fabrication processes often incur defects resulting from alignment variations of subsurface layers or patterns or particulate contaminants. FIGS. 1, 2A, and 2B show repetitive electronic circuits 10 of an IC device or workpiece 12 that are typically fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable circuit links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program a logic product, gate arrays, or ASICs.

Links 22 are designed with conventional link widths 28 of about 2.5 microns, link lengths 30, and element-to-element pitches (center-to-center spacings) 32 of about 2 microns or less from adjacent circuit structures or elements 34, such as link structures 36. Link dimensions and pitches are continually being reduced by device manufacturers. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys such as nickel chromide, metal nitrides such as titanium or tantalum nitride, metal silicides such as tungsten silicide, or other metal-like materials.

Circuits 10, circuit elements 14, or cells 20 are tested for defects. The links to be severed for correcting the defects are determined from device test data, and the locations of these links are mapped into a database or program. Laser pulses have been employed for more than 20 years to sever circuit links 22. FIGS. 2A and 2B show a laser spot 38 of spot size diameter 40 impinging a link structure 36 composed of a link 22 positioned above a silicon substrate 42 and between component layers of a passivation layer stack including an overlying passivation layer 44 (shown in FIG. 2A but not in FIG. 2B) and an underlying passivation layer 46 (shown in FIG. 2B but not in FIG. 2A). FIG. 2C is a fragmentary cross-sectional side view of the link structure of FIG. 2B after the link 22 is removed by the laser pulse.

FIG. 3 is a plan view of a beam positioner travel path 50 performed by a traditional link processing positioning system. Because links 22 are typically arranged in rows 16 and columns 18 (representative ones shown in dashed lines), the beam position and hence the laser spots 38 are scanned over link positions along an axis in a first travel direction 52, moved to a different row 16 or column 18, and then scanned over link positions along an axis in a second travel direction 54. Skilled persons will appreciate that scanning may include moving the workpiece 12, moving the laser spot 38, or moving the workpiece 12 and the laser spot 38. Skilled persons will also appreciate that many different link layouts are possible and that FIG. 3 is merely a representative layout.

Traditional positioning systems are characterized by X-Y translation tables in which the workpiece 12 is secured to an upper stage that moves along a first axis and is supported by a lower stage that moves along a second axis that is perpendicular to the first axis. Such systems typically move the workpiece relative to a fixed beam position or laser spot 38 and are commonly referred to as stacked stage positioning systems because the lower stage supports the inertial mass of the upper stage which supports workpiece 12. These positioning systems have excellent positioning accuracy because interferometers are typically used along each axis to determine the absolute position of each stage. This level of accuracy is preferred for link processing because the laser spot size 40 is typically only a little bigger than link width 28, so even a small discrepancy between the position of laser spot 38 and link 22 can result in incomplete link severing. In addition, the high density of features on semiconductor wafers results in small positioning errors potentially causing laser damage to nearby structures. Stacked stage positioning systems are, however, relatively slow because the starting, stopping, and change of direction of the inertial mass of the stages increase the time required for the laser tool to process all the designated links 22 on workpiece 12.

In split-axis positioning systems, the upper stage is not supported by, and moves independently from, the lower stage and the workpiece is carried on a first axis or stage while the tool, such as a fixed reflecting mirror and focusing lens, is carried on the second axis or stage. Split-axis positioning systems are becoming advantageous as the overall size and weight of workpieces 12 increase, utilizing longer and hence more massive stages.

More recently, planar positioning systems have been employed in which the workpiece is carried on a single stage that is movable by two or more actuators while the tool remains in a substantially fixed position. These systems translate the workpiece in two dimensions by coordinating the efforts of the actuators. Some planar positioning systems may also be capable of rotating the workpiece.

Semiconductor Link processing ("SLP") systems built by Electro Scientific Industries, Inc. ("ESI") of Portland, Oreg. employ on-the-fly ("OTF") link processing to achieve both accuracy and high throughput. During OTF processing, the laser beam is pulsed as a linear stage beam positioner passes designated links 12 under the beam position. The stage typically moves along a single axis at a time and does not stop at each link position. The on-axis position of beam spot 38 in the direction travel 52 does not have to be accurately controlled; rather, its position is accurately sensed to trigger laser spot 38 to hit link 22 accurately.

In contrast and with reference again to FIG. 3, the position of beam spot 38 along cross-axes 56 or 58 is controlled within specified accuracy as the beam positioner passes over each link 22. Due to the inertial mass of the stage or stages, a set-up move to start an OTF run produces ringing in the cross-axis position, and the first link 22 in an OTF run cannot be processed until the cross-axis position has settled properly. The settling delay or setting distance 60 reduces processing throughput. Without a settling delay (or, equivalently, a buffer zone of settling distance 60) inserted before the first laser pulse, several links 22 would be processed with serious cross-axis errors.

Although OTF speed has been improved by accelerating over gaps in the link runs, one limiting factor on the effectiveness of this "gap profiling" is still the requirement for the cross axis to settle within its specified accuracy. At the same time, feature sizes, such as link length 30 and link pitch 32, are continuing to decrease, causing the need for dimensional precision to increase. Efforts to further increase the performance of the stage or stages substantially increase the costs of the positioning system.

The traditional way to provide for two-axis deflection of a laser beam employs a high-speed short-movement positioner ("fast positioner") 62, such as a pair of galvanometer driven mirrors 64 and 66 shown in FIG. 4. FIG. 4 is a simplified depiction of a galvanometer-driven X-axis mirror 64 and a galvanometer-driven Y-axis mirror 66 positioned along an optical path 70 between a fixed mirror 72 and focusing optics 78. Each galvanometer-driven mirror deflects the laser beam along a single axis. U.S. Pat. No. 4,532,402 of Overbeck discloses a stacked stage beam positioning system that employs such a fast positioner, and U.S. Pat. Nos. 5,751,585 and 5,847,960 of Cutler et al. disclose split-axis beam positioning systems in which the upper stage(s) carry at least one fast positioner. Systems employing such fast positioners are used for nonlink blowing processes, such as via drilling, because they cannot currently deliver the beam as accurately as "fixed" laser head positioners.

The split-axis nature of such positioners may introduce rotational Abbe errors, and the galvanometers may introduce additional positioning errors. In addition, because there must be separation between the two galvanometer-controlled mirrors, the mirrors cannot both be located near the entrance pupil to the focusing optics. This separation results in an offset of the beam that can degrade the quality of the focused spot. Moreover, two-mirror configurations constrain the entrance pupil to be displaced farther from the focusing optics, resulting in an increased complexity and limited numerical aperture of the focusing optics, therefore limiting the smallest achievable spot size. Even assuming such positioners could be used for link-severing, the above-described spot quality degradation would cause poor quality link-severing or incomplete link-severing and result in low open resistance across severed links 22.

What is still needed, therefore, is a system and method for achieving higher link-processing throughput while maintaining focused spot quality.

SUMMARY OF THE INVENTION

An object of the invention is, therefore, to provide a system and/or method for achieving higher link-processing throughput while maintaining focused spot quality.

Another object of the invention is to employ a two-axis steering mirror to correct for linear stage settling errors.

A further object of the invention is to provide a positioner system employing coordinated motion for semiconductor link processing applications.

This invention preferably employs a two-axis steering mirror, pivotally mounted at the entrance pupil of the focusing lens, to perform small-angle motions that deflect the laser beam enough to compensate for cross-axis settling errors on the order of tens of microns. Although the settling errors occur in both axes, one embodiment of this invention is concerned primarily with correcting settling errors in a cross-axis direction to the OTF direction of linear stage travel. A two-axis steering mirror is employed for these corrections because either axis of the linear stage may be used as the OTF axis. The beam steering mirror is preferably used for error correction only and does not require coordination with or modification of the linear stage position commands, although such coordination is possible. The steering mirror may also be employed to correct for various sensed system errors, such as thermal drift, optical distortions, and optical path device errors that lead to laser beam wandering.

At least three technologies can be used to tilt a mirror in two axes about a single pivot point. Two of these technologies create a fast steering mirror (FSM) using voice coil actuators or piezoelectric actuators to tilt a mirror. Piezoelectric FSMs are preferred. Deformable mirrors represent a third technology and employ piezoelectric or electrostrictive actuators to deform the surface of a mirror. Other beam steering technologies can be used to tilt a mirror in practice of the invention.

Advantages of the invention include the elimination of cross-axis settling time, resulting in increased throughput particularly for SLP systems. The invention also facilitates improved manufacturability of the main positioning stage(s) due to relaxed servo performance requirements because the steering mirror can correct for linear stage errors.

Additional objects and advantages of this invention will be apparent from the following detailed description of preferred embodiments thereof which proceed with reference to the accompanying drawings.

DETAILED DESCRIPTION OF PREFERRED EMBODIMENTS

One embodiment of a representative beam positioning system is described in detail in U.S. Pat. No. 4,532,402 of Overbeck, which is assigned to the assignee of this application. A preferred X-Y stage is a "Dynamix" model available from Newport Corporation of Irvine, Calif.

The beam positioning system preferably employs a laser controller that controls a stacked, split-axis, or planar positioner system and coordinates with reflectors to target and focus laser system output to a desired laser link 22 on IC device or workpiece 12. The beam positioning system permits quick movement between links 22 on the same or different workpieces 12 to effect unique link-severing operations based on provided test or design data. The beam positioning system may alternatively or additionally employ the improvements, beam positioners, or coordinated motion schemes described in U.S. Pat. Nos. 5,751,585, 5,798,927, and 5,847,960 of Cutler et al., which are assigned to the assignee of this application. Other fixed head or linear motor driven conventional positioning systems could also be employed, as well as the systems employed in the 9000, 9800, and 1225 model series manufactured by ESI of Portland, Oreg., the assignee of this patent application.

Figure 4:
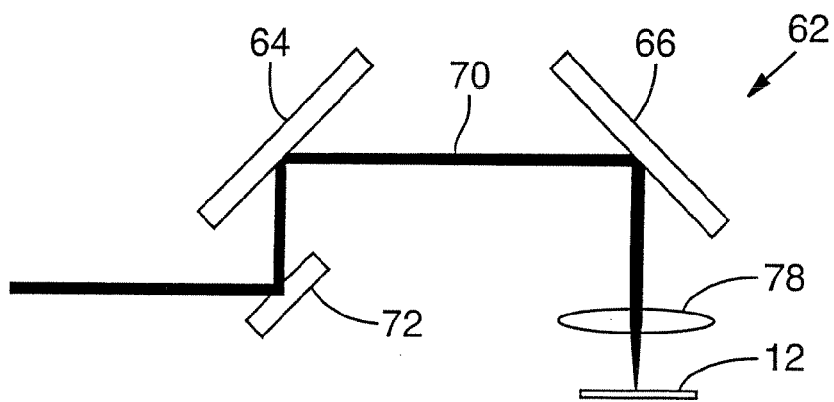
FIG. 4 is a simplified side view of a prior art fast positioner employing a pair of galvanometer-driven mirrors that deflect the laser beam along different respective single axes.
Figure 5:
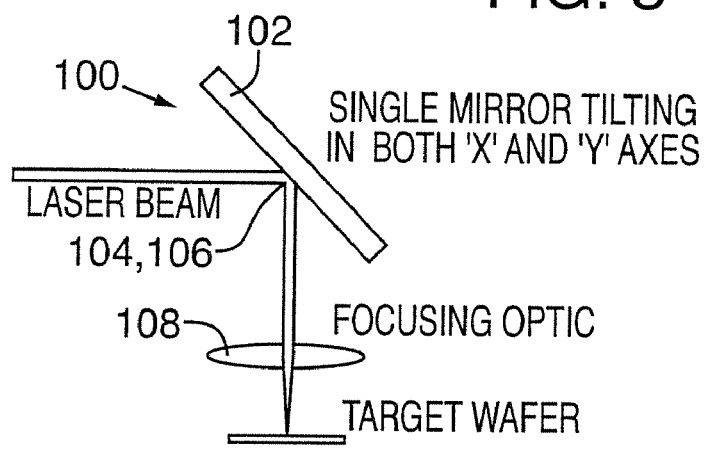
FIG. 5 schematically illustrates a side sectional view of a preferred two-axis mirror employed in the practice of the invention.
Figure 6:
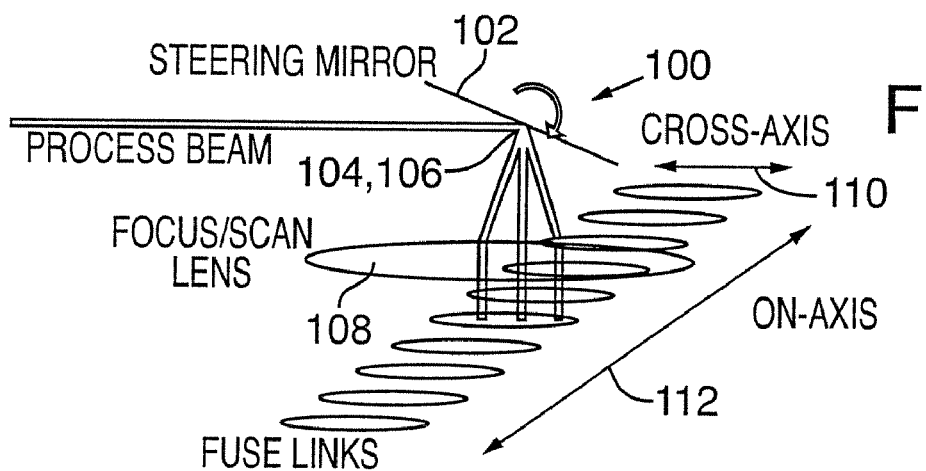
FIG. 6 schematically illustrates a partial front view of a preferred two-axis mirror employed in the practice of the invention.

With reference to FIGS. 5 and 6 and with respect to this invention, the final turn mirror of a fixed head system or alternatively fast positioner 66 (FIG. 4) is preferably replaced by a single high-speed, high-accuracy two-axis steering mirror system 100 that includes a mirror 102 capable of actuation with at least two degrees of freedom. Mirror 102 has a centrally positioned pivot point 104 that preferably coincides with an entrance pupil 106 of a focusing lens 108. Two-axis steering mirror system 100 is preferably used for error correction, although it may be employed for beam steering because either axis of the linear stage may be used as the OTF axis.

Because the beam is focused to a very fine spot size for SLP applications, the mechanism directing mirror system 100 preferably pivots the mirror 102 along at least two axes about pivot point 104, which is located at or near the entrance pupil of focusing optics or lens 108. Small angle perturbations in the position of mirror 102 deflect the beam enough to correct for linear stage settling errors at the work surface, and because mirror 102 is located at or near the entrance pupil of focusing lens 108, the beam is shifted without distorting the focused spot, allowing delivery of a small, high quality spot.

In one embodiment, settling errors in a cross-axis direction 110 are corrected by mirror 102, while motion in an on-axis direction 112 is not corrected. This single axis correction allows the linear stage interferometer feedback to be the sole source of laser pulse triggering. However, with proper coordination, on-axis direction 112 steering mirror 102 motion is possible, although it complicates the design and introduces additional error sources that can degrade on-axis direction 112 accuracy if such errors are not addressed.

Motion in each axis of mirror 102 exhibits scale factor and offset errors, noise, and cross-axis coupling. These error sources can be well-controlled and calibrated out in the system, with noise and temperature stability effects controlled through conventional design techniques.

Figures 1, 2A, 2B, 2C:
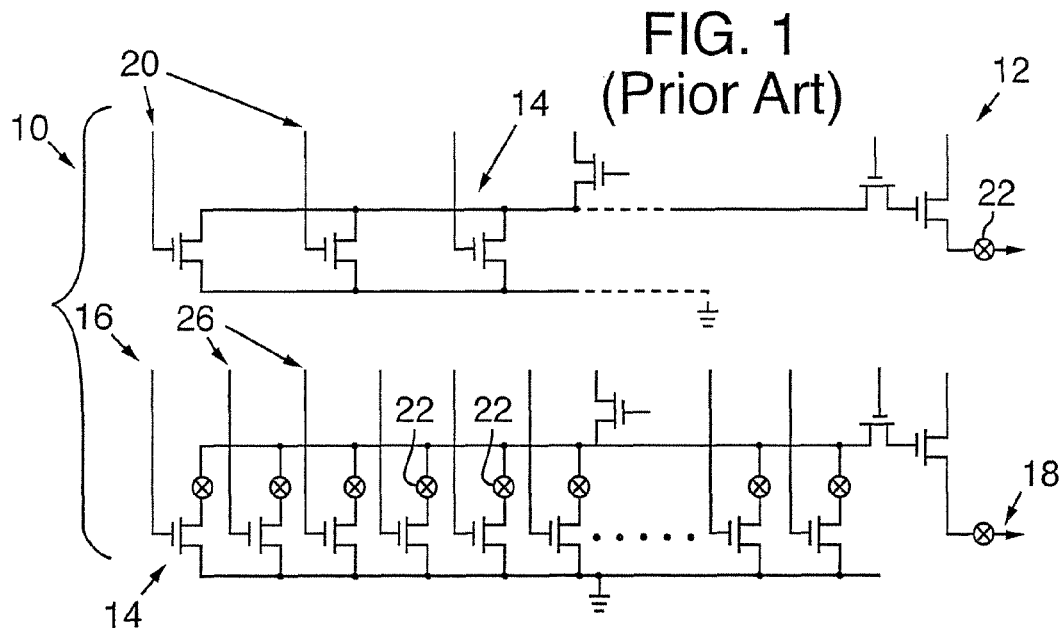
FIG. 1 is a schematic diagram of a portion of a DRAM showing the redundant layout of and programmable links in a spare row of generic circuit cells.
FIG. 2A is a fragmentary cross-sectional side view of a conventional, large semiconductor link structure receiving a laser pulse characterized by prior art pulse parameters.
FIG. 2B is a fragmentary top view of the link structure and the laser pulse of FIG. 2A, together with an adjacent circuit structure.
FIG. 2C is a fragmentary cross-sectional side view of the link structure of FIG. 2B after the link is removed by the prior art laser pulse.
Figure 3:
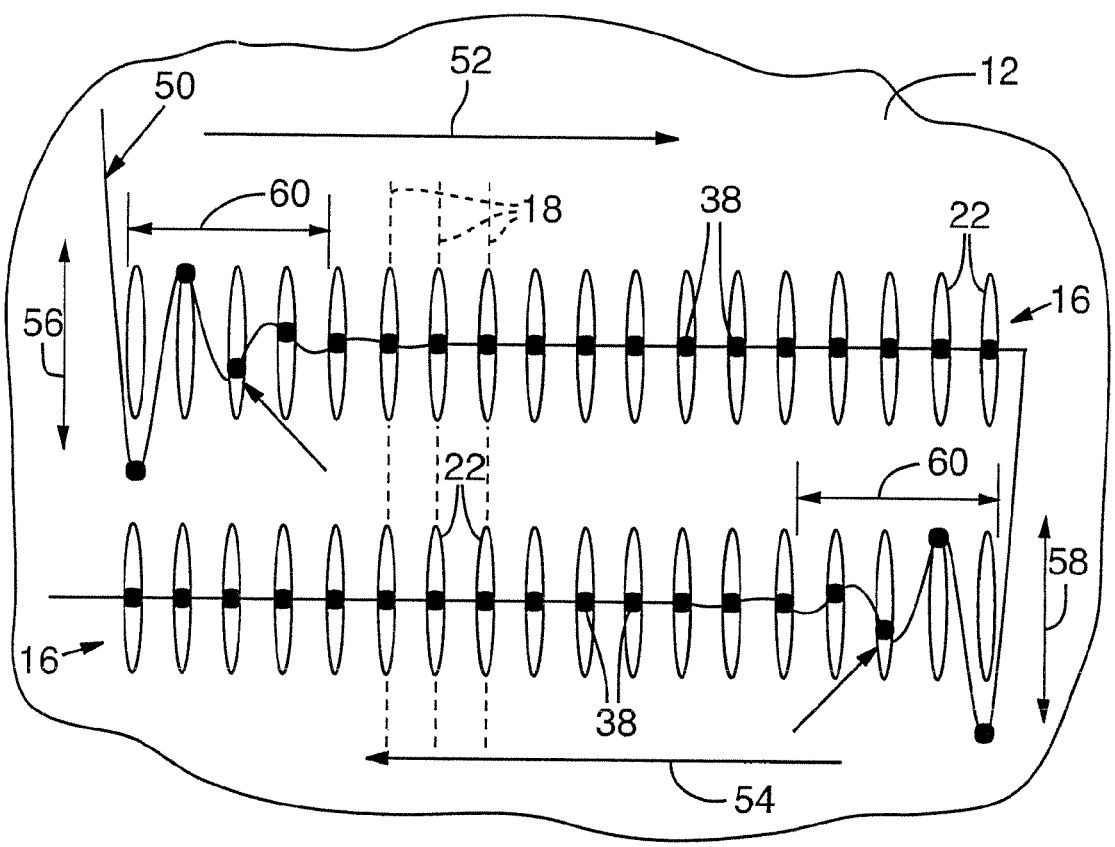
FIG. 3 is a plan view of a prior art beam travel path.

Calibration of mirror system 100 through beam-to-work ("BTW") alignments can correct for any non-linearity and alignment errors in steering mirror 102. Traditionally, the term beam-to-work is used as nomenclature for the process of scanning the linear stage back and forth, while directing the laser beam spot at low power at an alignment target on the wafer or workpiece 12 (FIG. 1). Optical measurements of the reflection off the target are used to precisely determine target and hence wafer location. By scanning several targets with BTW scans, the offset and rotation of the wafer relative to the beam spot can be ascertained. It is also possible to map out other effects such as axis orthogonality and positional distortions.

After mirror system 100 is added to the laser system, traditional BTW type scans can be used to map out any inaccuracies/nonlinearities in steering mirror 102 response. This is accomplished by doing a BTW scan with mirror 102 in the nominal zero offset (in either axis) position. Then mirror 102 is tilted, and another BTW scan is performed to determine how much lateral offset of the laser beam spot is imparted by the tilt. By measuring the offset caused by numerous mirror tilts in the U and V axes, mirror system 100 can be fully characterized.

Once the response of mirror system 100 is determined to sufficiently fine precision, then instead of moving the linear stage back and forth, it is possible to use mirror system 100 for subsequent BTW type alignment scans.

Figure 7:
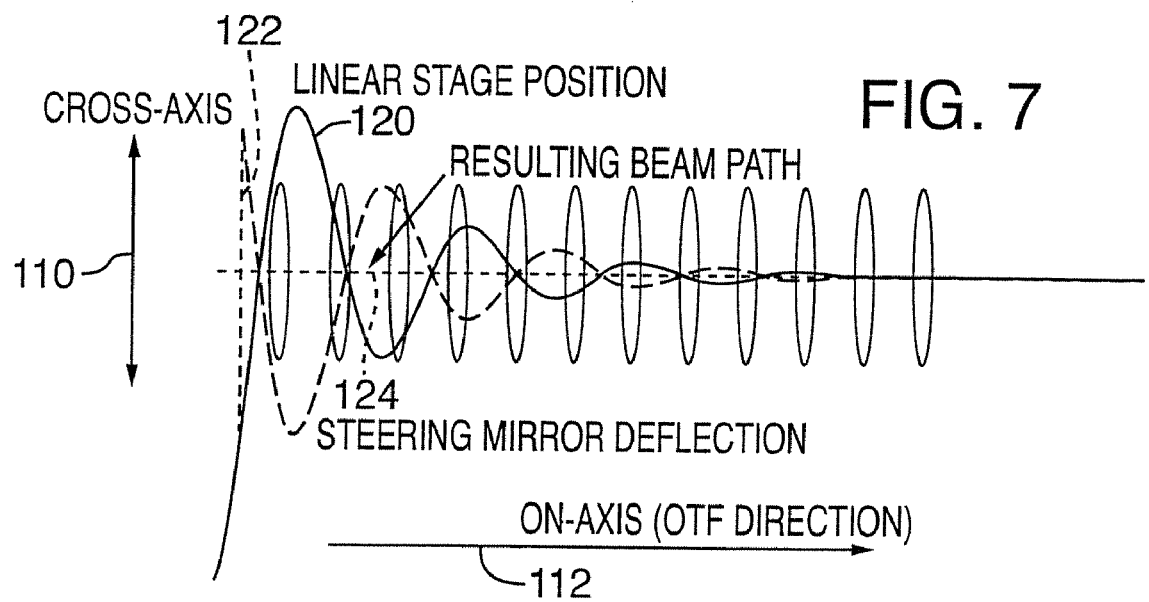
FIG. 7 illustrates the effect of the steering mirror during the OTF run.

FIG. 7 illustrates the corrective effect of two-axis steering mirror system 100 during an OTF run. A linear stage ringing is represented by a ringing curve 120. Mirror 102 deflects the laser beam in cross-axis direction 110 as represented by a correction curve 122 that is the inverse of ringing curve 120. The resulting beam position is the sum of the linear stage motion and the deflected beam position and is represented by a resulting beam path curve 124, which is free from cross-axis error.

Figure 8:
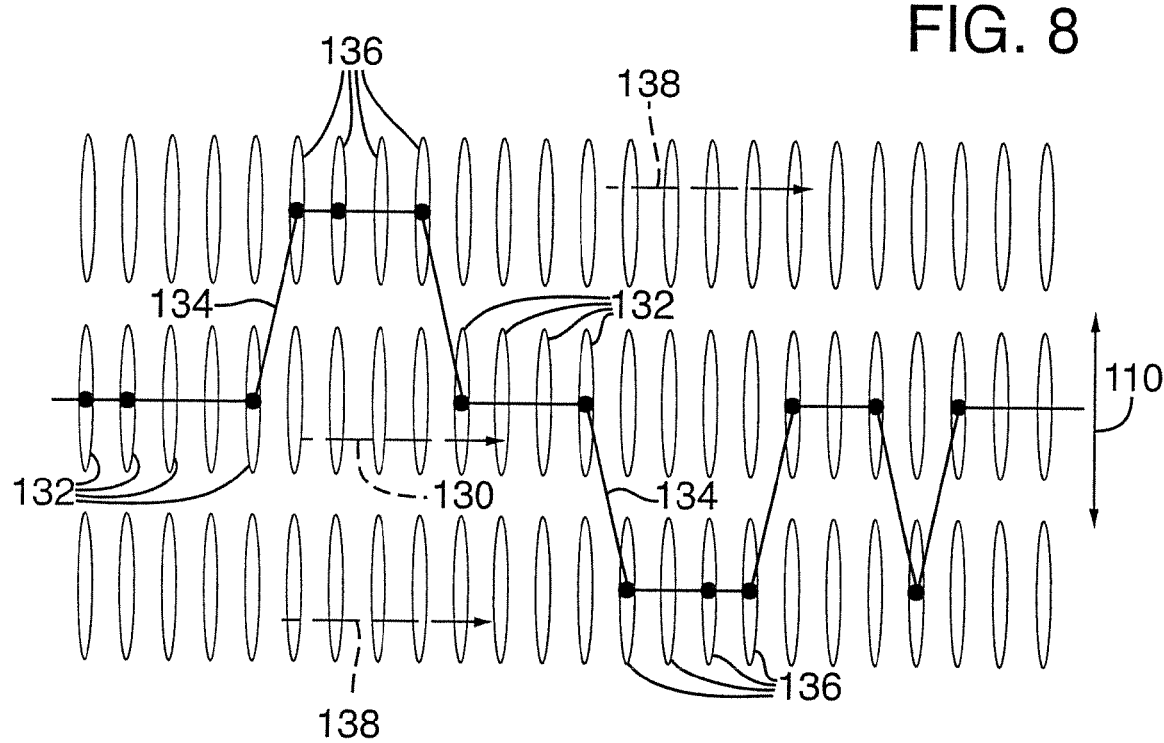
FIG. 8 illustrates an exemplary multi-row, cross-axis dithering ("MRCAD") operational mode work path.

FIG. 8 illustrates using steering mirror system 100 for MRCAD processing during boustrophedon or raster scanning in the context of link severing to further improve the speed at which links are blown. In a preferred mode of operation, MRCAD scanning is done in cross-axis direction 110 while moving along a row 130 of links 132. In preferred embodiments, MRCAD scanning employs steering mirror 102 (FIGS. 5 and 6) to direct the laser beam along a pathway 134 at links 132 and adjacent links 136 in adjacent rows 138 without needing to move the slower linear motion stage in cross-axis direction 110. This is possible because not all the links in each row need to be blown. Link processing becomes far more efficient with MRCAD because the linear or stages do not have to be scanned or slewed down each row, so the total number of link row scans can be substantially reduced. As integration increases and link sizes, spot sizes, and pitch distance decrease, MRCAD scanning will become an even more valuable technique.

In another mode, supplemental on-axis dithering ("SOAD") uses mirror 102 to deflect the beam in on-axis direction 112 (FIGS. 5-7). In this operational mode, the beam can be quickly directed ahead in on-axis direction 112, severing links while the linear motion stage catches up. The SOAD scan ahead or scan behind the stage feature allows the positioning system to reduce stage velocity changes or to sever several links during a single slowed movement segment.

As indicated above, there are at least three technologies that can be employed to tilt mirror 102 in two axes about pivot point 104. The FSMs, which are preferred, use voice coil actuators or piezoelectric actuators to tilt the surface of mirror 102. Suitable voice coil actuated FSMs are available from Ball Aerospace Corporation of Broomfield, Colo. and Newport Corporation of Irvine, Calif. However, the preferred actuator is a model S-330 Ultra-Fast Piezo Tip/Tilt Platform manufactured by Physik Instrumente ("PI") GmbH & Co. of Karlsruhe, Germany.

Traditional galvanometers are not typically used for this application because they each tilt a mirror about only one axis and ordinarily have insufficient positioning accuracy. Moreover, a pair of physically separated galvanometer mirrors is required for two axes of actuation. This separation is incompatible with the desire that actuation occur about one pivot point located near the entrance pupil of focusing lens 108 (FIGS. 5 and 6) to maintain a high quality laser spot at the surface of workpiece 12. Nevertheless, it is possible to employ galvanometer deflected mirrors in this invention, particularly if employed in single-axis and small deflection applications to maintain accuracy and well focused laser spots.

Figure 9:
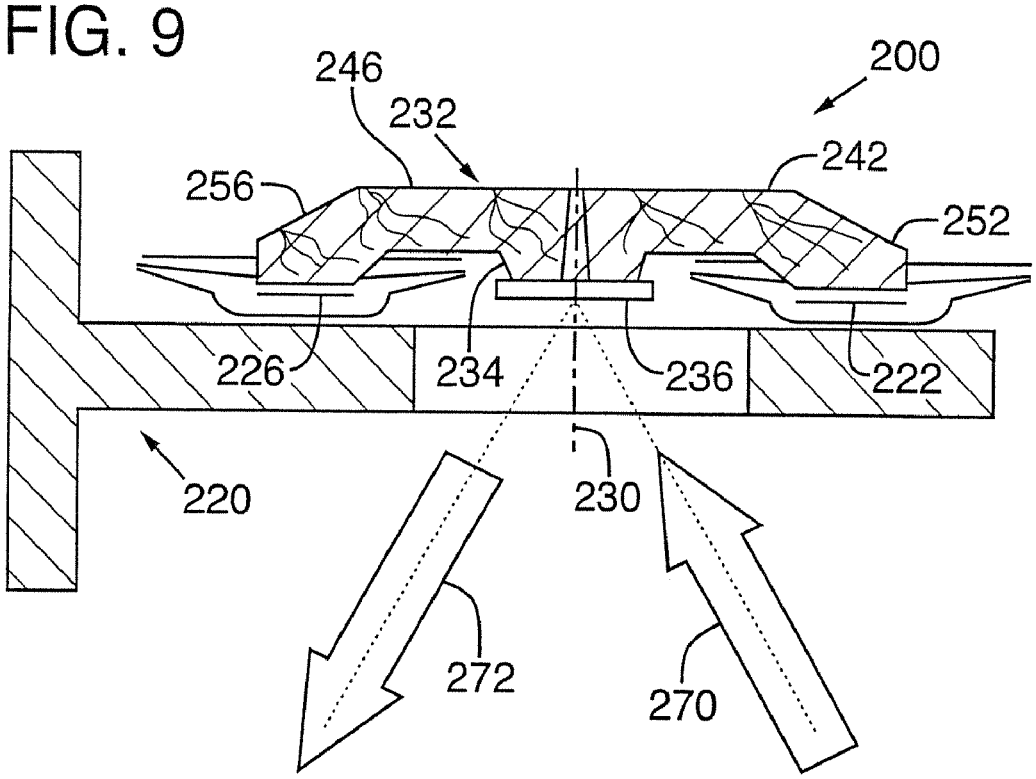
FIG. 9 is a side sectional view of a representative two-axis steering mirror.
Figure 10:
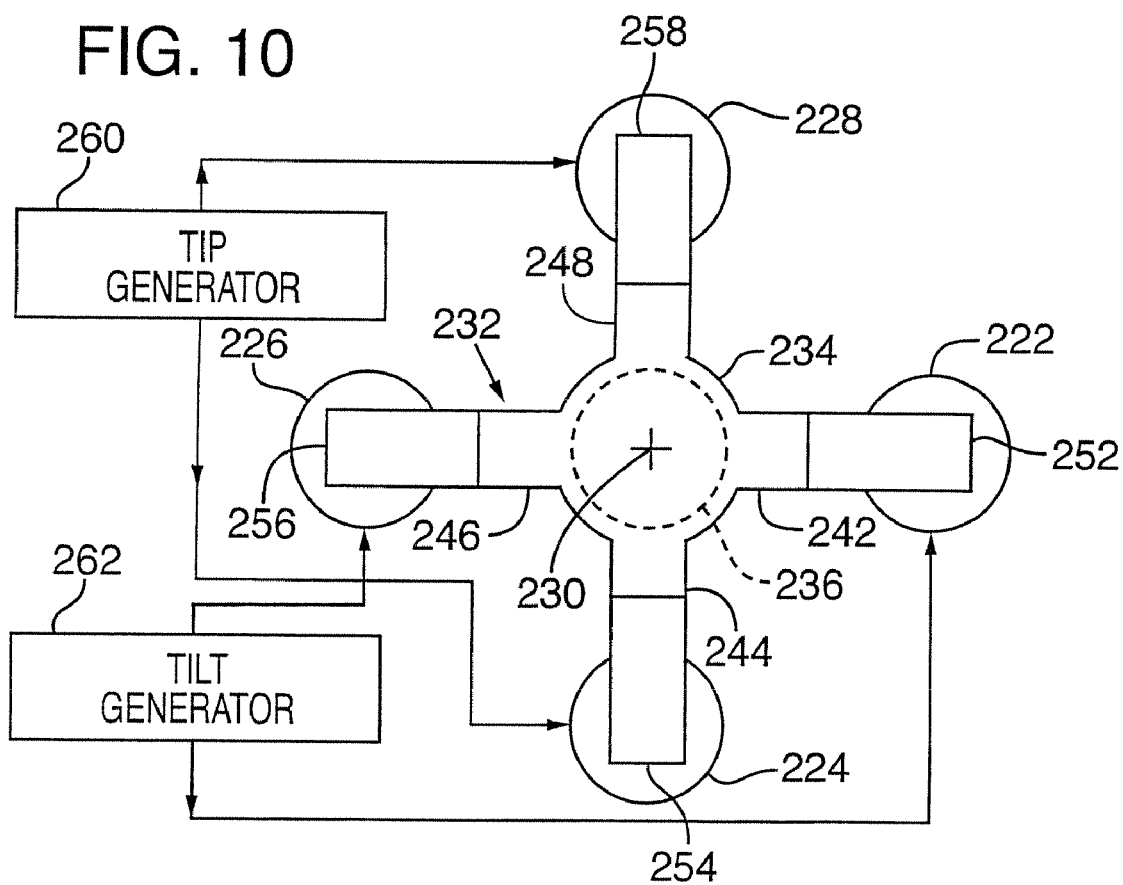
FIG. 10 is a simplified plan view of a representative two-axis steering mirror.

By way of example only, FIGS. 9 and 10 show an FSM two-axis mirror system 200 in which four electrical to mechanical vibration generators or transducers are supported by a transducer support platform 220 in a quadrature relationship, whereby transducers 222, 224, 226, and 228 are positioned at 0, 90, 180, and 270 degrees with respect to a central axis 230; therefore, adjacent ones of the transducers are set at right angles with respect to each other. A movable mirror support member 232 has a central portion or hub 234 bearing a mirror or reflective surface 236 centered with respect to axis 230. Mirror 236 has a diameter of about 30 mm or less to reduce its weight and facilitate high frequency response for desired beam correction. Mirror 236 is coated with conventional laser optical coatings to account for laser wavelength or design parameters.

Four lightweight rigid struts or elongated members 242, 244, 246, and 248 extend radially from hub 234 of mirror support member 232, and have respective peripheral terminal portions 252, 254, 256, and 258 affixed to respective transducers 222, 224, 226, and 228, which are electrically movable voice coils. For a further description of a suitable conventional voice coil/loudspeaker arrangement, see Van Nostrand's Scientific Encyclopedia, Sixth Edition, page 1786. The use of such conventional loudspeaker coils for the transducers to perform mechanical actuation, decreases the manufacturing cost of the apparatus. The floating mirror support 232 can beneficially be made of a lightweight material, such as metal (e.g. aluminum or beryllium) or plastic, enabling rapid response to the electrical input signals to the voice coils to be described.

A tip control generator 260 is connected to transducers 224 and 228 to cause them to move in a complementary "push pull" relationship with each other. Similarly, a tilt control generator 262 is connected to transducers 222 and 226 to cause these coils to also move in a complementary push pull relationship with each other. A laser beam 270 is reflected off reflective surface 236 and a reflected beam 272 is positioned by the generators controlling the cross axis, which is perpendicular to OTF direction of travel, to compensate for cross axis errors. The pairs of signals produced by each generator assume a push-pull relationship, so that when transducer 222 is pulling upper terminal portion 252 of support member 232 to the right in FIG. 10, lower transducer 226 is pushing terminal portion 256 to the left, to tilt reflective surface 236, thereby deflecting reflected beam 272. The actuation can be alternated at the beginning of an OTF run, for example, to move reflective surface 236 at a proper frequency and damped amplitude to compensate for linear stage ringing in cross-axis direction 110, thereby eliminating the negative effects of linear stage settling time and producing a relatively straight beam path. Thus, links that would otherwise be in the conventional buffer zone can be processed accurately.

Mirror systems suitable for use with this invention can be implemented with a large enough field to do MRCAD scans by providing beam deflection in a range of about 50 to 100 microns; however, such mirror systems can also be implemented for cross-axis correction only by providing beam deflection in a range of about 10 to 50 microns or as little as about 10 to 20 microns. The mirror is preferably positioned within about plus or minus 1 mm of the entrance pupil of the focusing lens. These ranges are exemplary only and can be modified to suit the system design and particular link processing applications.

The preferred model S-330 Tip/Tilt Platform manufactured by PI uses piezoelectric actuators for high speed, two-dimensional mirror tilting. Strain gage sensors accurately determine mirror position and provide feedback signals to the control electronics and drive circuitry. A more complete description of the model S-330 Tip/Tilt Platform is available at the PI web site, www.physikinstrumente.com.

The main advantages of the PI Piezo Tip/Tilt Platform are that the device is commercially available and has a very compact size that readily mounts in an ESI model 9820 positioning system.

A disadvantage of the PI Piezo Tip/Tilt Platform is that its beam deflection range limits its use in the MRCAD application of FIG. 8, even though the beam deflection range is sufficient for error correction applications. Specifically, the PI Piezo Tip/Tilt Platform is capable of a "⊥" 5 micron beam deflection range. Positioning the linear stage in the cross-axis direction to enable the steering mirror to process one row of links with a +4 micron deflection and then positioning the linear stage to process an adjacent row of links with a −4 micron deflection would afford an 8 micron shift of the laser beam in the cross-axis direction. Combining the operations of the linear stage and steering mirror in this manner leaves available very little remaining beam deflection range. Moreover, nonlinear motion, thermal drive, hysteresis, and high-voltage actuation are all inherent problems with piezoelectric actuation that have to be accounted for. Calibration techniques, application of feedback control, and good system design can appropriately manage these challenges.

In addition to all the other above-described advantages, this invention permits a relaxation on the requirements for the linear motors perk time, settling time) using the secondary system to correct for errors. This substantially reduces the cost of the linear motors and also reduces the dependency of the system throughput on the acceleration limit of the linear stage or stages.

Figure 11:
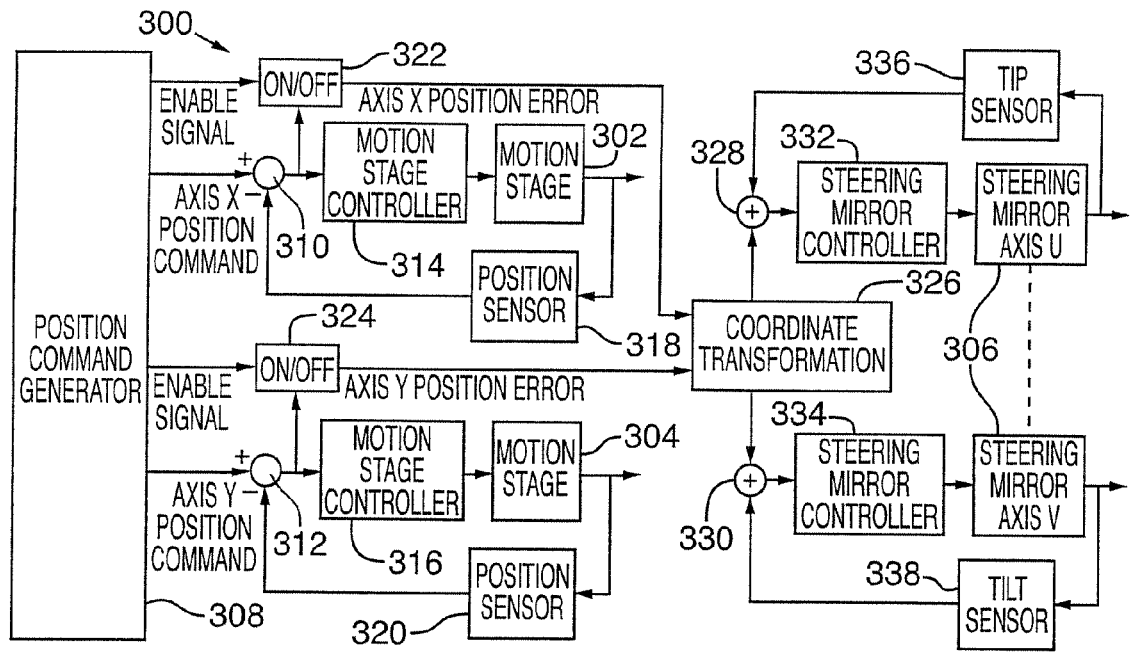
FIG. 11 is a simplified schematic block diagram of an exemplary positioner control system for coordinating the stage positioning and the steering mirror for error correction.

FIG. 11 shows an embodiment of a positioner control system 300 of this invention for coordinating the positioning of X- and Y-axis motion stages 302 and 304, and also the positioning of a two-axis steering mirror 306 for positioning error correction. Of course, motion stages 302 and 304 may be combined into a single planar motion stage having positioning control in the X- and Y-axis directions. In a standard operational mode, two-axis steering mirror 306 is used to correct positioning errors caused by X- and Y-axis motion stages 302 and 304.

A position command generator 308 generates X- and Y-axis position command signals for delivery through summing junctions 310 and 312 to X- and Y-axis motion controllers 314 and 316 to respective X- and Y-axis motion stages 302 and 304. The actual positions of X- and Y-axis motion stages 302 and 304 are sensed by respective X- and Y-axis position sensors 318 and 320 and signals representing the actual positions are conveyed to adders or summing junctions 310 and 312 to generate X- and Y-axis position error signals. X- and Y-axis motion controllers 314 and 316 receive the error signals and act to minimize any errors between the commanded and actual positions. For high-accuracy applications, X- and Y-axis position sensors 318 and 320 are preferably interferometers.

Residual error signals, such as those generated by ringing, are conveyed through enabling gates 322 and 324 to a coordinate transformation generator 326, which may be optional depending on whether motion stages 302 and 304 share a common coordinate system with two-axis steering mirror 306. In either event, the residual error signals are passed through adders or summing junctions 328 and 330 to U- and V-axis steering mirror controllers 332 and 334, which act to tip and/or tilt steering mirror 306 by controlled amounts to deflect, for example, laser beam 270 (FIG. 9) to correct for positioning errors of X- and Y-axis motion stages 302 and 304. The actual tip and/or tilt positions of two-axis steering mirror 306 are sensed by respective tip and tilt sensors 336 and 338 and signals representing the actual tip and tilt positions are conveyed to adders or summing junctions 328 and 330 to generate tip and tilt position error signals. U- and V-axis steering mirror controllers 332 and 334 receive the error signals and act to correct any errors between the commanded and actual positions. For high-accuracy applications, two-axis steering mirror 306 is preferably a piezoelectric tilt/tip platform, and position sensors 318 and 320 are preferably strain gages. Suitable alternative sensors may include optical, capacitive, and inductive sensing techniques. In this embodiment, skilled workers will understand that U- and V-axis steering mirror controllers 332 and 334 should be adapted to provide zero to 100 volt drive signals to the piezoelectric actuators deflecting two-axis steering mirror 306.

Enabling gates 322 and 324 implement a provision in which position command generator 308 can selectively disable position error correction for either the X or the Y axis, thereby enabling error correction for the cross-axis while leaving the on-axis unaffected, or vice versa.

Figure 12:
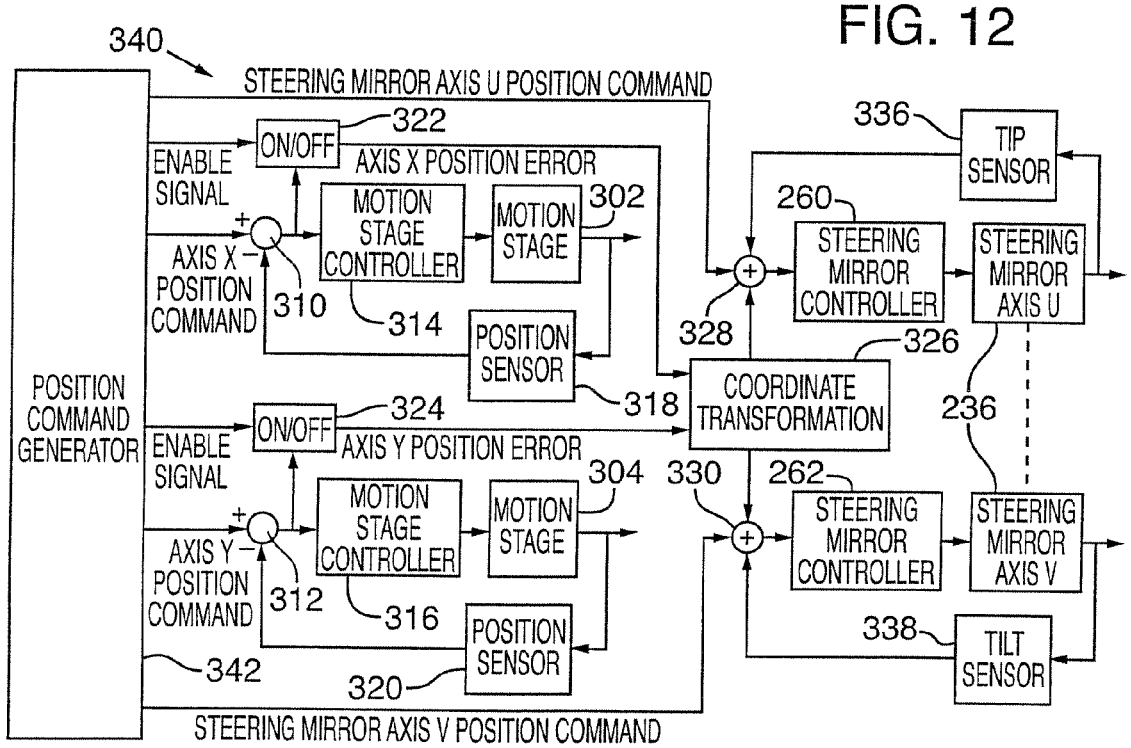
FIG. 12 is a simplified schematic block diagram of an exemplary positioner control system for coordinating the stage positioning and the steering mirror for beam-to-work scans and error correction.

FIG. 12 shows an embodiment of a positioner control system 340 for coordinating the positioning of X- and Y-axis motions stages 302 and 304 and, in this embodiment, FSM 236 (FIGS. 9 and 10) for MRCAD scans and positioning error correction. In an extended operational mode, the steering mirror is used for error correction and MRCAD scanning. In this mode of operation, a position command generator 342 generates X- and Y-axis positioning commands for X- and Y-axis motion stages 302 and 304 and also U- and V-axis tip and tilt commands for deflecting FSM 236. Summing junctions 328 and 330 generate the positioning command for FSM 236 as the sum of the error signals from X- and Y-axis motion stages 302 and 304 and, in this embodiment, also the U- and V-axis tip and tilt commands.

The error signals are generated in the same manner as in the standard error correction mode. The additional U- and V-axis tip and tilt commands are produced by position command generator 342 to accomplish the desired beam-to-work scanning. Because beam-to-work and MRCAD applications typically require wider ranges of mirror deflection, this embodiment of the invention preferably employs voice coil actuated FSM two-axis mirror system 200. However, the following MRCAD applications further allow using a FSM having a more limited range of mirror deflection.

The MRCAD link processing application of FIG. 8 shows combining three adjacent link runs into an MRCAD link run by employing cross-axis laser beam positioning. In the preferred operating mode, FSM 200 is employed to deflect the laser beam a first link run to laterally spaced link runs because it is faster than the linear stage. While the FSM is very fast and is excellent for jumping laterally, it has a limited deflection range. Therefore, this invention further includes alternate operational modes, some of which also employ the linear stage for cross-axis motion. Other operational modes employ only the linear stage for cross-axis motion.

Figure 13:
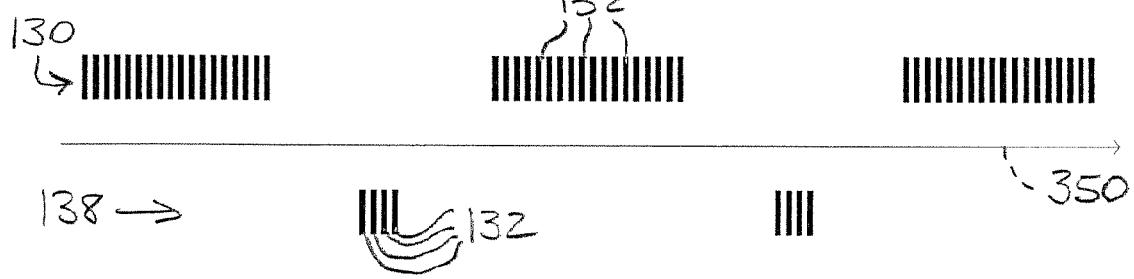
FIG. 13 illustrates a first alternative MRCAD operational mode work path in which the non-deflected laser beam pathway runs between adjacent rows of links.

FIG. 13 shows an operational mode in which the linear stage positions a non-deflected laser beam pathway 350 between row 130 and adjacent row 138 of links 132, and employs the FSM to provide all or a portion of the positioning required to process selected ones of links 132. For example, if the centers of rows 130 and 138 of links are separated by 10 microns, and the FSM has a deflection range of "±" 6 microns, then the FSM can be employed to very quickly deflect the laser beam to either row 130 or adjacent row 136 for processing links 132 in either row. In this operational mode, the FSM not only corrects for linear stage positioning errors, but also provides lateral (or even on-axis) motion for link processing. Of course, the FSM can execute this mode of link processing with or without position error correction.

Figure 14:
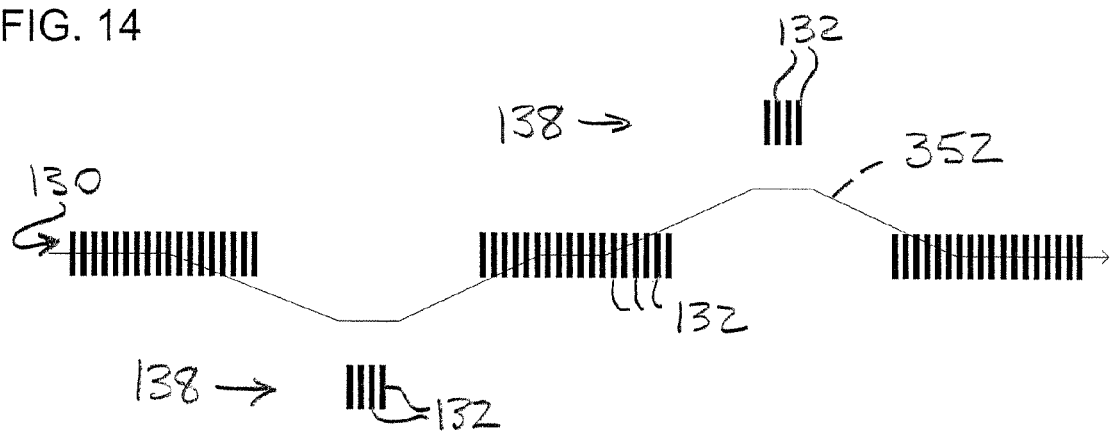
FIG. 14 illustrates a second alternative MRCAD operational mode work path in which the non-deflected laser beam pathway cross-axis position is adjusted as its on-axis motion progresses along selected link rows.

FIG. 14 shows another operational mode in which a non-deflected laser beam pathway 352 is defined when the linear stage cross-axis position is adjusted as its on-axis motion progresses along rows 130 and 138 of links 132. The linear stage cross-axis position may also be changed while processing links. The FSM is used to quickly supply any additional laser beam deflection necessary to properly process links 132 in the desired cross-axis location in an MRCAD link run.

A link run, as defined by the prior art, has one cross-axis position. An MRCAD link run is defined as a synthesis of multiple link runs and may have numerous cross-axis positions. An MRCAD link run does not reverse on-axis direction but may have any cross-axis move profile, including reversals.

Figure 15A:
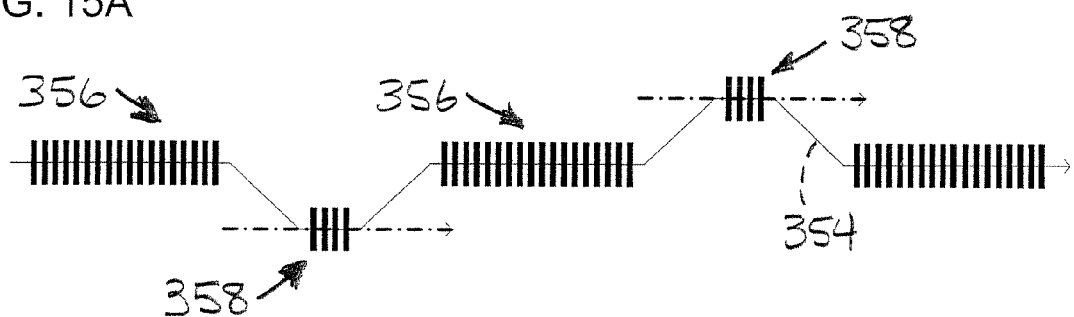
FIG. 15A illustrates a third alternative MRCAD operational mode work path in which the non-deflected laser beam path cross-axis position is adjusted to coincide with the desired link blow position as the on-axis motion of the laser beam progresses along selected link rows.

FIG. 15A shows another operational mode in which a laser beam pathway 354 is adjusted in the cross-axis direction using only the linear stage as the on-axis motion progresses along row 356 and adjacent rows 358. An aspect of this operational mode of the invention is to combine link runs into an MRCAD link run without an FSM. It is possible to implement non-deflected laser beam pathway 354 without an FSM. Although the linear motion stages cannot move the laser beam relative to the workpiece as fast as an FSM, the linear stages can, nevertheless, reduce link processing time and increase throughput.

Figure 15B:
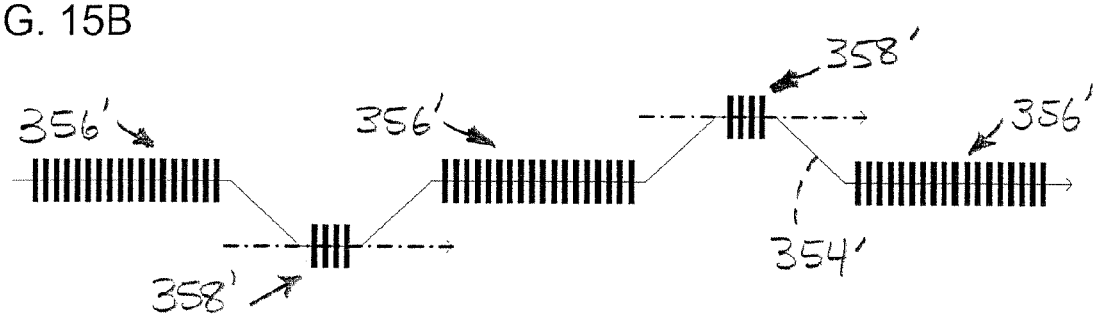
FIG. 15B illustrates a fourth alternative MRCAD operational mode work path in which shorter link runs are nested within longer link runs.

There are many different ways to combine link runs as defined by the prior art to synthesize an MRCAD link run. Combinations may be between two, three, or more link runs, provided there is sufficient time for each lateral move. FIG. 15B shows a laser beam pathway 354' that is the same as laser beam pathway 354 of FIG. 15A, except for the manner in which the laser beam is positioned. Laser beam pathway 354' represents a combined laser path resulting from FSM deflection either alone or in cooperation with cross-axis positioning. FIG. 15B depicts an operational mode for nesting shorter link runs 358' within longer link runs 356'. A non-deflected laser beam pathway 354' represents the combined motion path. Without combining link runs, it would be necessary to process links along a central linear pathway and perform link runs along the adjacent link runs, as indicated in dash-dot lines. Pathway 354' is merely illustrative and may not be followed exactly because of variable link spacing, row spacing, and other variables. Any pathway may be followed between links that are to be processed, and any combination of stage movement and/or steering mirror movements may be used in the processing of link runs and MRCAD link runs.

Processing of links 132 (FIG. 14) and links 356 and 358 (FIGS. 15A and 15B) is preferably carried out by repetitively performing the following process:

1) Determine whether link runs with a cross-axis separation can be combined and determine an appropriate non-deflected beam pathway for an MRCAD link run.

2) Move to a starting position for an MRCAD link run by executing acceleration, deceleration, stop, and fast settle steps. The time to execute these steps varies, depending upon the distance traveled.

3) Perform the MRCAD link run. Performing an MRCAD link run entails ramping up to velocity to begin the link run, moving along the desired pathway to process links, and ramping down and stopping again. While performing prior art link runs or MRCAD link runs, it is preferred to accelerate, or gap profile, over large gaps, which reduces the time required to perform such link runs. Skilled persons will appreciate that stopping need not take place before the start of a subsequent link run or MRCAD link run. Moreover, MRCAD runs can be intermixed with traditional prior art link runs. Other processing steps, machining activities, or positioner motion may take place between link runs of either the prior art or MRCAD type.

If two laterally spaced link runs can be combined, there is an immediate time savings for each combined link run. However, this time savings is balanced against time lost if gaps that could be profiled are reduced in size, or if gap profiling becomes impossible due to moving laterally and processing links out of a separate parallel link run.

It is possible to transition from one link run to an adjacent link run whenever the lateral move time is less than or equal to the time required to move in the on-axis direction between processed links. This is expressed mathematically as:

$$T\text{lateral move} <= \text{Distance on-axis}/V\text{link run}.$$

The time to move laterally varies depending upon the lateral distance, the speed performance parameters of the motion stage and/or steering mirror, move profiling time, and settling time before reaching the next link to be processed.

Figure 16:
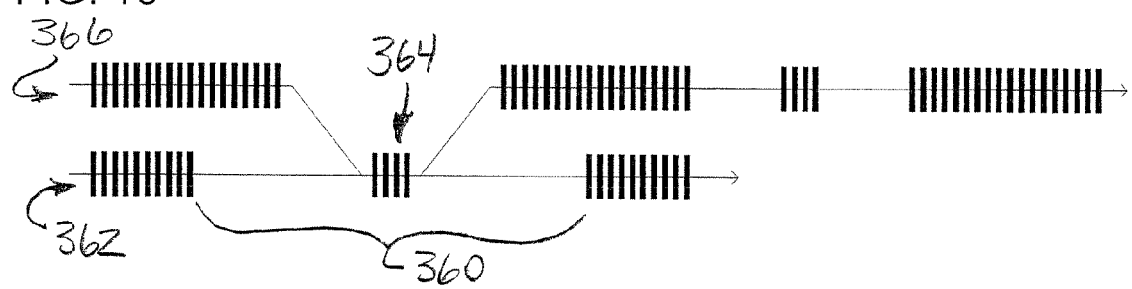
FIG. 16 illustrates a fifth alternative MRCAD operational mode work path in which the effective size of a gap in a link run can be extended by processing a portion of first link run in a second link run.

In another operational mode, it is possible to combine portions of nearby link runs. FIG. 16 shows an example in which the effective size of a gap 360 in a link run 362 can be extended by processing a portion 364 of link run 362 in a different, MRCAD link run 366. The overall number of link runs is not reduced, but throughput is increased by decreasing the time to complete link run 362 through the use of gap profiling applied to one large gap rather than two smaller gaps. Gap profiling of one large gap is faster because higher peak on-axis velocity may be reached and there is only one settling event. By processing portion 364 of link run 362 during MRCAD link run 366, the effective length of gap 360 is increased, whereas without such lengthening, it may not be possible to perform gap profiling.

Figure 17:
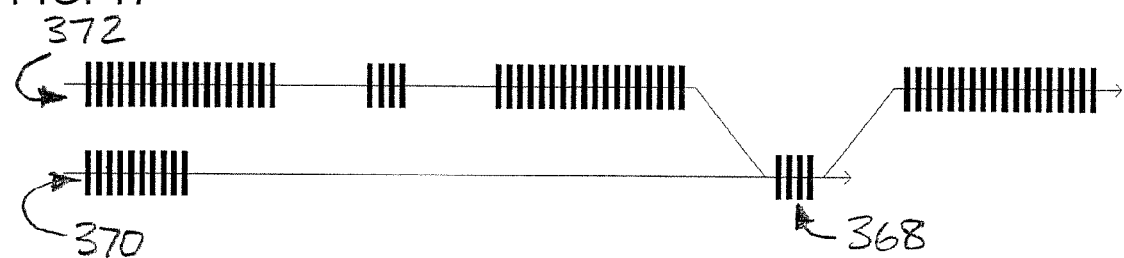
FIG. 17 illustrates a sixth alternative MRCAD operational mode work path in which end links of a link run are processed during processing of an adjacent link run.

FIG. 17 shows another operational mode in which end links 368 of a link run 370 are processed during processing of an adjacent, MRCAD link run 372. Such processing of end links 368 effectively shortens link run 370, resulting in faster processing of link run 370, which saves time and increases throughput.

Figure 18:
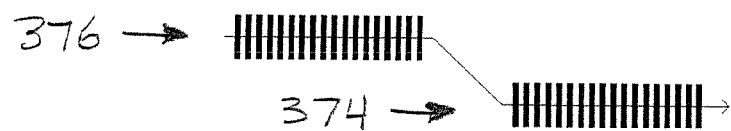
FIG. 18 illustrates a seventh alternative MRCAD operational mode work path in which a first link run is combined with a second link run.

FIG. 18 shows another operational mode in which a link run 374 is combined with a link run 376 to form an MRCAD link run by starting processing in link run 376 and finishing link processing in link run 374. In this mode it is not necessary to laterally move back to link run 376, which saves time and increases throughput.

The operational modes described with reference to FIGS. 15A, 15B, 16, 17, and 18 can be implemented by cross-axis stage positioning and/or FSM deflection.

The above-described MRCAD operational modes may be applied to motion stages and/or steering mirrors of different performance characteristics and structures from those described herein.

In typical operation, the steering mirror commands for MRCAD scanning are used to produce cross-axis motion of the laser beam without commanding on-axis motion of the laser beam. However, other applications are envisioned that would benefit from on-axis supplemental dithering to boustrophedon scanning.

The invention also facilitates relaxed servo performance requirements of the main positioning stages because the steering mirror can correct for linear stage errors, thermal expansions, optical path errors, and various other system errors.

The control schemes depicted in these figures are intended to illustrate the basic implementation and operation of this invention. Skilled persons will readily appreciate that alternative communication and control structures can be used to practice this invention. This invention further includes more advanced control schemes, such as those employing sensor-based position correction and feedforward commands to the motion stages and steering mirror.

Figure 19:
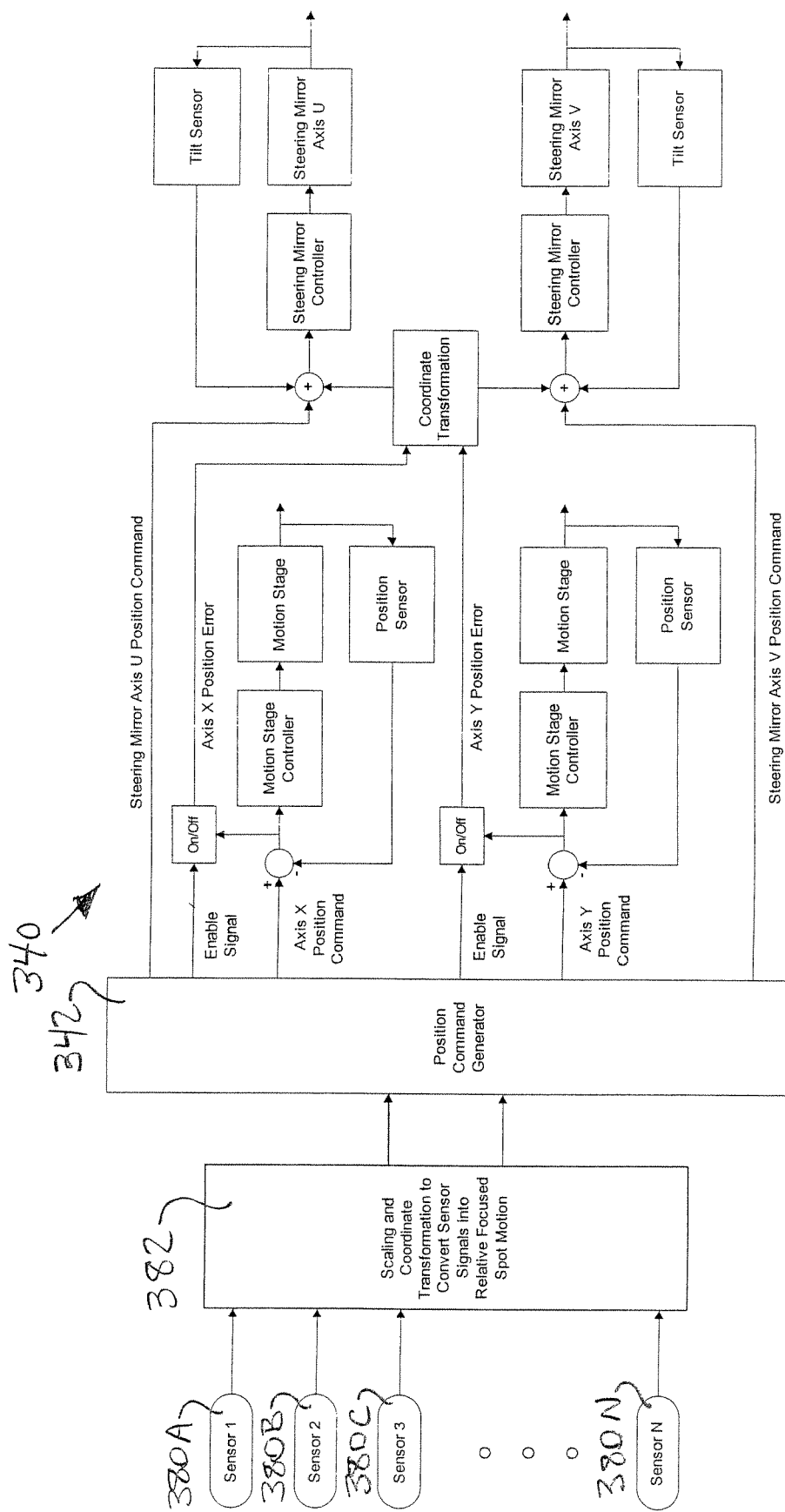
FIG. 19 is a simplified schematic block diagram representing the positioner control system of FIG. 12, and further including sensors and a sensor controller for correcting various sensed beam position errors.

For example, FIG. 19 shows a group of sensors 380A, 380B, 380C, ..., 380N (collectively, "sensors 380") electrically connected to a signal conditioner 382 that performs sensor signal scaling and coordinate transformations to convert the sensor signals into relative focused spot motion commands for actuating a beam steering device, such as two-axis steering mirror 306 (FIG. 11) or reflective surface 236 (FIG. 12). Alternatively, signal conditioner 382 may produce steering mirror commands directly in any coordinate system without an intermediate step of producing commands in the coordinate system of the focused spot. Sensors 380 may include sensors for detecting many different phenomena such as position, relative position, displacement, velocity, beam position, beam quality, optical power, temperature, atmospheric pressure, humidity, air movement, and/or turbulence. Position sensors may include interferometric, capacitive, inductive, strain, magnetic, and resistive sensors, optical encoders, optical position sensitive detectors, and CCD arrays. Sensors 380 may include a beam position sensor for correcting errors detected in the optical path, such as thermally induced beam wandering in response to laser or acousto-optic modulator ("AOM") pointing instability, or optical mount dynamics. Other types of alternative sensors will be apparent to those skilled in the art.

In the FIG. 19 embodiment, signal conditioner 382 is electrically connected to position command generator 342 (FIG. 12), which provides positioning command information and control in positioner control system 340 (FIG. 12). Positioner control system 340 may alternatively include one or more single input/single output controller (SISO) and/or one or more multiple input/multiple output controller (MIMO). For example, the two axes of the linear stage may be controlled by a single MIMO controller, rather than two separate SISO controllers. It is also possible for a single MIMO controller to control the linear stage axes and the steering mirror axes. Those skilled in the art of feedback control will understand that there are many different control system architectures and algorithms for controlling multiple actuators in response to trajectory commands and sensed signals. The architectures depicted here are merely illustrative and are not intended to limit the scope of this invention to a particular architecture or control methodology.

Figure 20:
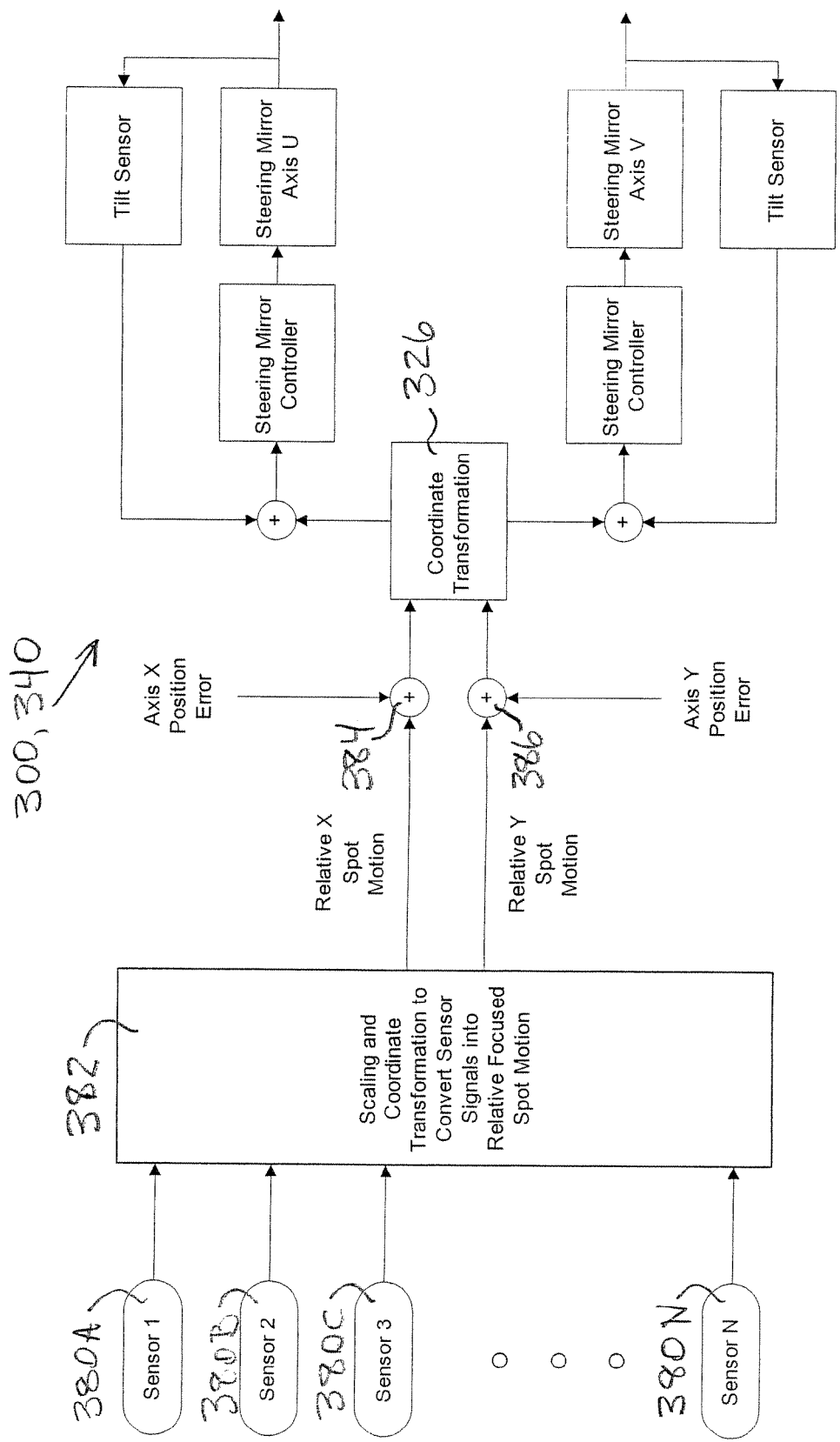
FIG. 20 is a simplified schematic block diagram representing a portion of the positioner control system of FIG. 11, further including sensors and a sensor controller for correcting various sensed beam position errors.

FIG. 20 shows a second embodiment, in which signal conditioner 382 provides relative X- and Y-axis spot motion control signals to summing junctions 384 and 386 that combine X- and Y-axis position error signal to provide positioning command information to coordinate transformation generator 326 (FIGS. 11 and 12) in positioner control systems 300 (FIG. 11) and 340 (FIG. 12).

Figure 21:
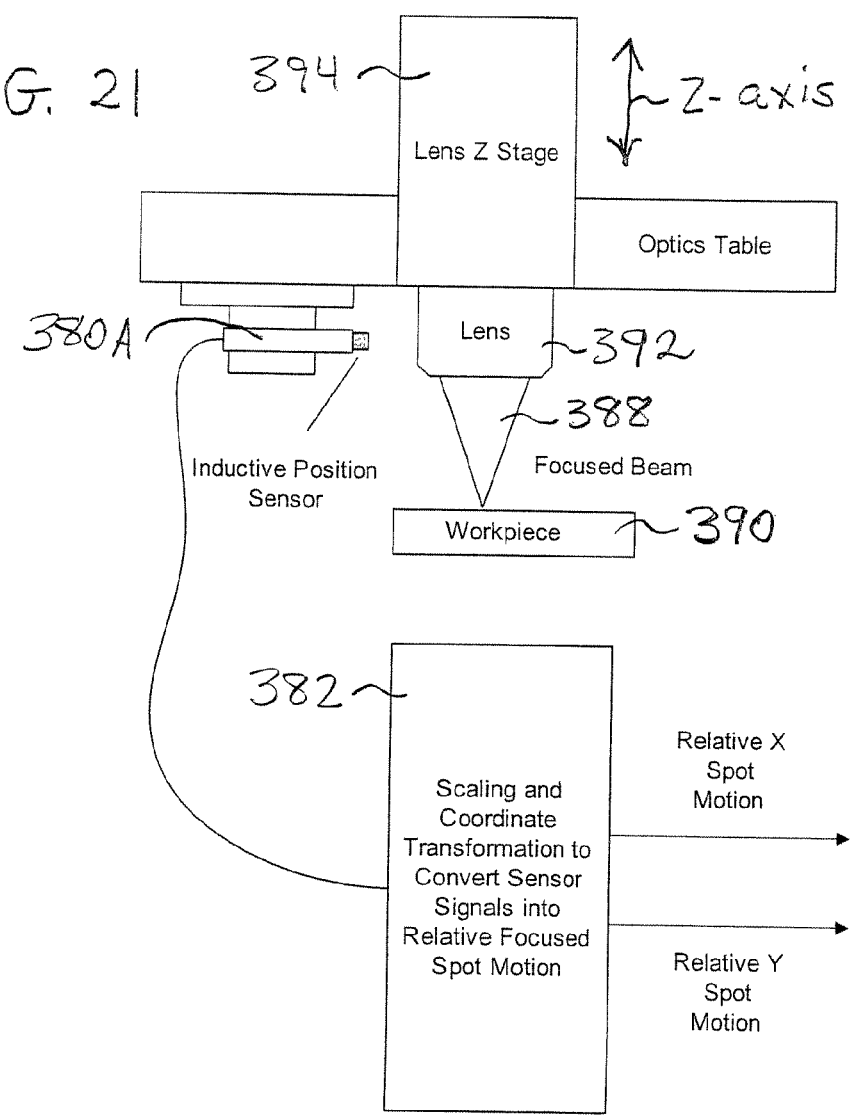
FIG. 21 is a simplified schematic block diagram representing a lens translation sensor coupled to the sensor controller of FIGS. 19 and 20 for correcting laser beam deflection errors caused by various Z-axis positions of the lens.

FIG. 21 shows a particular sensor embodiment, in which a laser beam 388 is focused on a workpiece 390 by propagating through a focus lens 392 that is translated in Z-axis directions by a lens Z stage 394. Undesirable lateral movement of lens 392 may cause wandering of the X- and Y-axis positions of laser beam 388 on workpiece 390. Undesirable lateral movement may be caused by Z-axis translation of the lens, thermal expansion of system components, or external forces applied to the optics table or other system components causing excitation of resonant modes or shifts in compliant structural components. In this embodiment, sensor 380A is an inductive position sensor that conveys to signal conditioner 382 a signal proportional to the Z-axis position of lens 392. Signal conditioner 382 includes correction information relating the sensed Z-axis positions of lens 392 to associated X- and Y-axis beam position errors and can, therefore, provide to the positioner control system the relative X- and Y-axis spot motion signals necessary to correct for the laser spot wandering errors. The correction information is preferably obtained by pre-characterizing the system, such as by measuring laser beam X- and Y-axis deviations as a function of various Z-axis positions.

Figure 22:
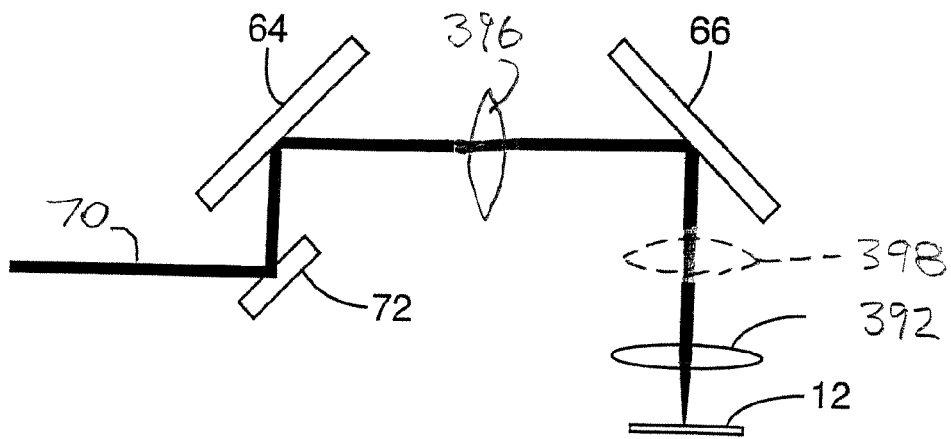
FIG. 22 is a simplified side view of a fast positioner employing a pair of galvanometer-driven mirrors in association with one or two relay lenses to, respectively, image a mirror pivot point at or near the surface of the other mirror or image both mirror pivot points at or near the entrance pupil of a focusing lens.

The entrance pupil of lens 392 is preferably positioned at or near the actual or virtual reflective surface of a two-axis FSM. A relay lens positioned before lens 392 may be associated with or positioned downstream of the FSM. As shown in FIG. 22, the two-axis FSM may be replaced by a pair of galvanometer-driven mirrors 64 and 66 and may include a relay lens 396 (represented as a single lens component) positioned between them to image the pivot point of mirror 64 at or near the surface of mirror 66. An optional relay lens 398 (shown in dashed lines) can be used in cooperation with relay lens 396 to image the pivot points of mirrors 64 and 66 at or near the entrance pupil of focusing lens 392. Skilled persons will appreciate that a relay lens positioned in optical association with a two-axis FSM steering mirror may be used to shift the steering mirror pivot point to a location at or near the entrance pupil of focusing lens 392.

Figure 23:
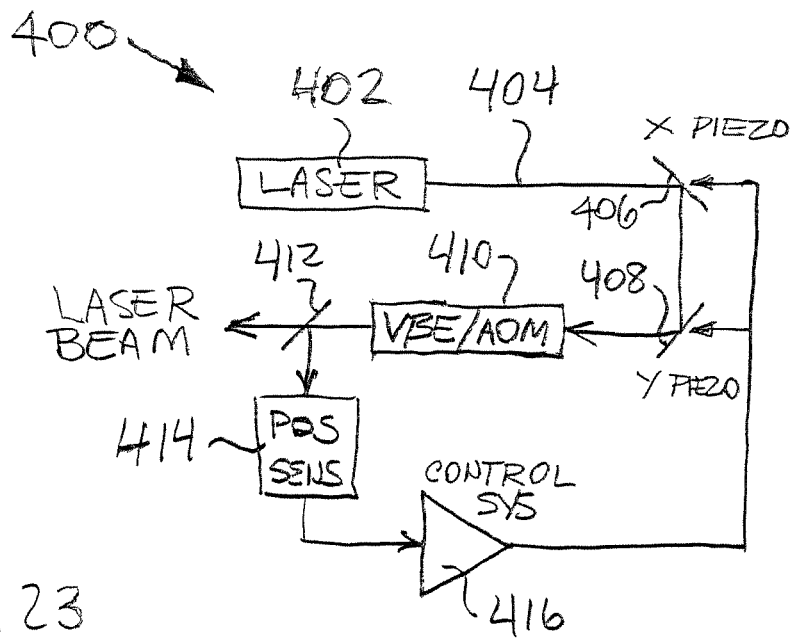
FIGS. 23-26 are simplified schematic block diagrams representing four embodiments of laser beam position correction systems of this invention.

As mentioned above, sensors 380 can be used to provide beam wandering correction signals that are derived from virtually any system-related source. For example, FIG. 23 shows a laser beam position correction system 400 in which a laser 402 emits a laser beam 404 that is deflected by X- and Y-axis piezoelectric-deflected mirrors 406 and 408 for propagation through optical path devices 410, such as a variable beam expander ("VBE") and an AOM. To reduce laser beam 404 positioning errors caused by optical path devices 410, a beam splitter 412 reflects a portion of deflected laser beam 404 to a beam position sensor 414. A control system 416 receives from beam position sensor 414 information related to the actual positions of laser beam 404 relative to the ideal positions. Control system 416 uses the information to generate X- and Y-axis correction signals for driving X- and Y-axis piezoelectric-deflected mirrors 406 and 408, or alternatively, an FSM, X- and Y-axis galvanometer deflected mirrors, or other beam steering technology. Beam wandering errors caused by optical path devices 410 may include low frequency drift caused by AOM thermal loading, VBE deflections as a function of beam expansion, and mechanical thermal expansion. Beam position sensor 414 is preferably a quad photo-detector or other position-sensitive detector (PSD).

Figure 24:
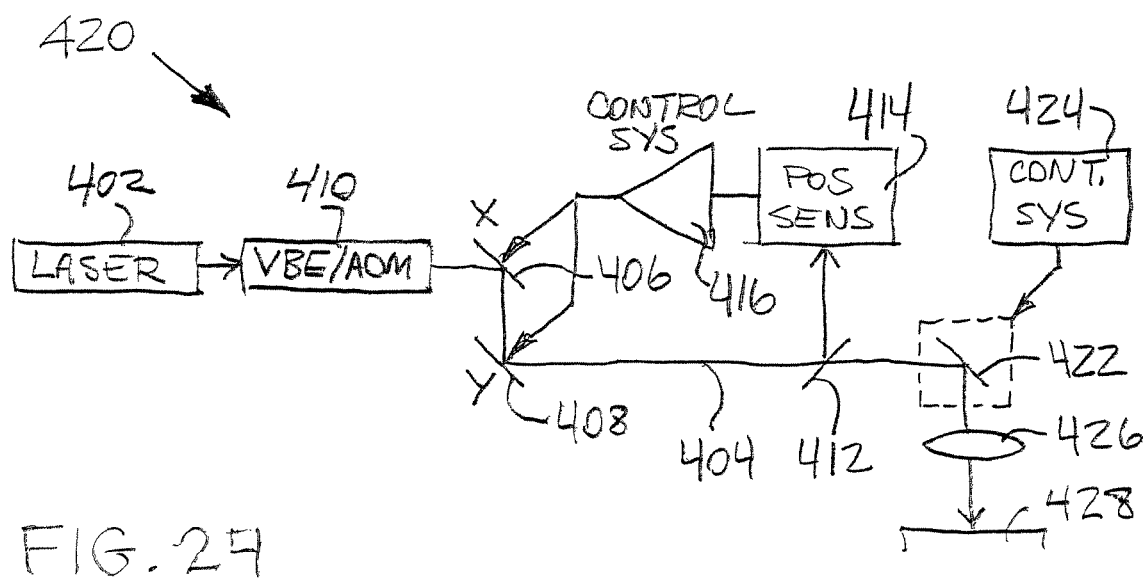

FIG. 24 shows another laser beam position correction system 420, in which optical path devices 410 are positioned before X- and Y-axis piezoelectric-deflected mirrors 406 and 408, and in which the system further includes a two-axis FSM 422 that is driven by a control system 424 for deflecting laser beam 404 through a focusing lens 426 to a workpiece 428. In this embodiment, primary and error correction positioning of laser beam 404 can be carried out jointly or separately by control system 414 or control system 424. It is preferred to separate FSM 422 from the thermal drift correction functions associated with control system 416.

Control system 424 is preferably implemented as a digital signal processor having FSM updating rate that is much higher than the positioning system servo cycle rate. FSM updating is accomplished by calculating desired XY stage positions at a higher rate than is necessary for the XY stage, such as by direct computation, or interpolation of the XY command during the present and subsequent servo cycles. The position error is then determined and conveyed to the FSM at a much higher rate.

Figure 25:
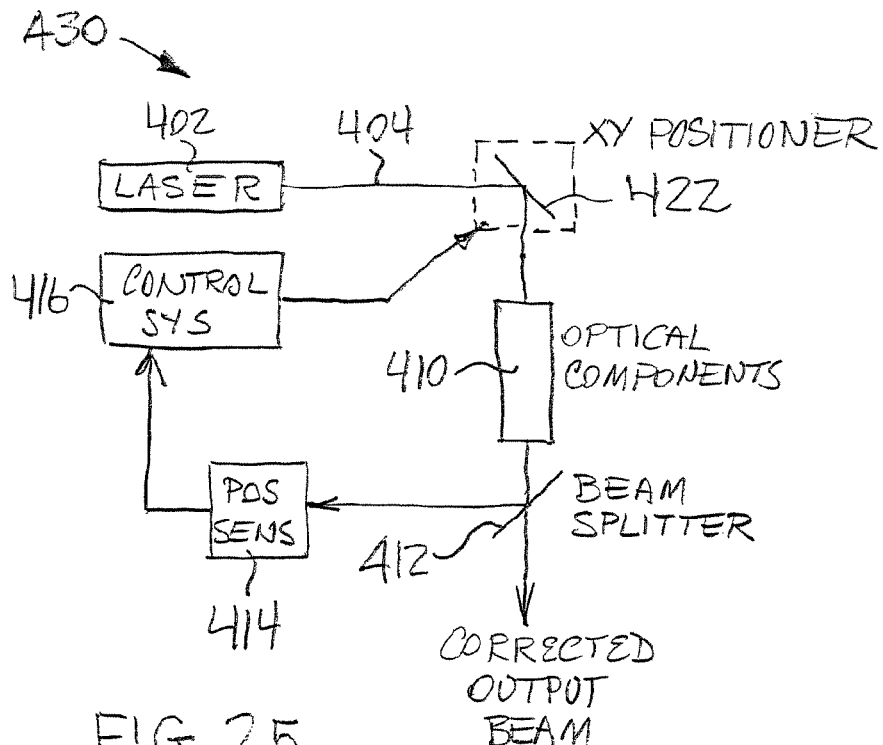
Figure 26:
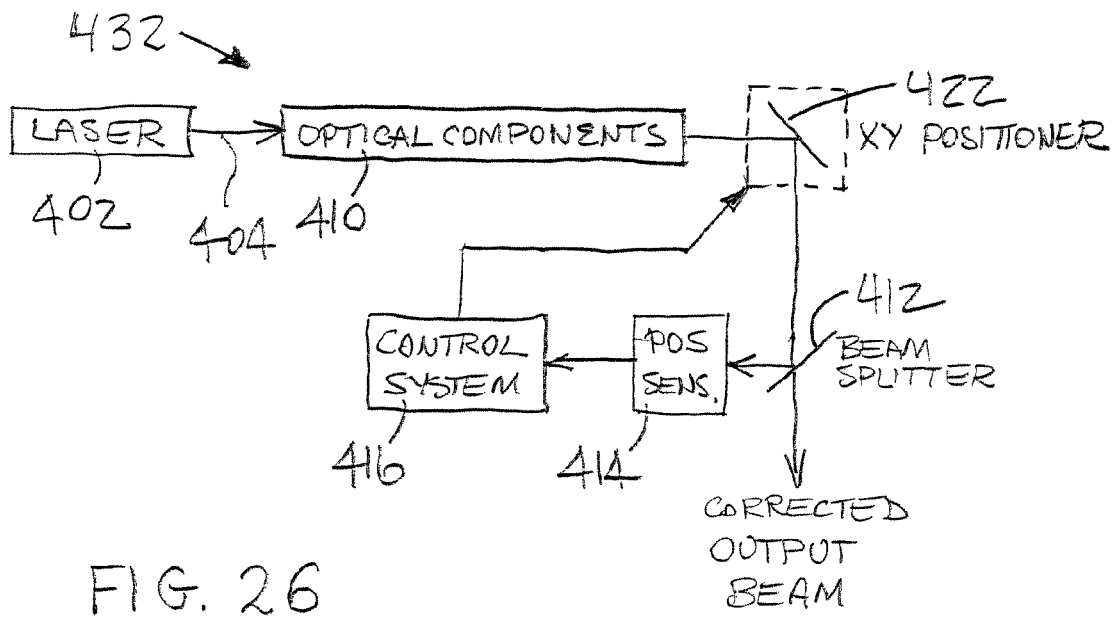

FIGS. 25 and 26 show alternative laser beam position correction systems 430 and 432, in which X- and Y-axis piezoelectric-deflected mirrors 406 and 408 are replaced by two-axis FSM 422. Laser beam position correction systems 430 and 432 also differ in that optical path devices 410 are positioned before or after two-axis FSM 422. Of course, depending on their functions, some or all of optical path devices 410 may be positioned in various locations along the path of laser beam 404.

The FSMs employed in this invention preferably have a full-deflection bandwidth greater than 1001 Hz, and, preferably greater than 1.000 Hz. Their deflection angle is preferably greater than 0.05 milliRadian, and preferably "±" 8 milliRadians, resulting in a "±" 50 micron displacement of laser beam 404 at the workpiece. Positioning accuracy of laser beam 404 is preferably within 50 nanoMeters, and deflection accuracy is preferably within 10 microRadians.

Skilled workers will appreciate that the two-axis steering mirror systems of this invention can be adapted for use in etched-circuit board via drilling, micro-machining, and laser trimming applications as well as for link severing. Moreover, laser-based wafer processing machines practicing this invention may employ single-axis deflection for processing wafer links in one axis direction, after which the wafer is rotated and links are processed in another axial direction, preferably orthogonal to the first direction.

It will be obvious to those having skill in the art that many changes may be made to the details of the above-described embodiment of this invention without departing from the underlying principles thereof. The scope of this invention should, therefore, be determined only by the following claims.

The invention claimed is:

1. A method for directing a laser beam toward a target location on a workpiece in response to target location coordinate position command information, comprising:
    positioning the workpiece and the laser beam relative to one another in response to the coordinate position command information;
    sensing an actual position of the workpiece relative to the coordinate position command information;
    producing one or more error signals indicative of a difference between the coordinate position command information and the actual position, the difference including an error signal component representing laser beam position errors at the workpiece;
    producing a position correction signal in response to each error signal produced;
    positioning a high-speed beam steering device adapted to receive the laser beam and, in response to the position correction signal, to impart to the laser beam angular motion that deflects the laser beam in a manner sufficient to compensate for the laser beam position errors, the high-speed beam steering device having a beam deflection range limited to less than or equal to 100 microns at the workpiece; and
    providing a focusing lens having an entrance pupil and positioned to receive the deflected laser beam and focus it on the target location on the workpiece, the high-speed beam steering device being within 1 mm of the entrance pupil.

2. The method of claim 1 in which the high-speed beam steering system comprises a fast steering mirror.

3. The method of claim 1 in which the high-speed beam steering device comprises a two-axis steering device.

4. The method of claim 1 in which the target location comprises any one of multiple target semiconductor links located in a first link row and in second and third link rows adjacent to the first link row, and in which positioning the workpiece and the laser beam relative to one another further comprises:
    providing relative motion between the focusing lens and the workpiece in a first travel direction generally parallel to the first link row;
    processing at least a first target semiconductor link in the first link row during a first pass in the first travel direction; and
    employing the high-speed beam steering system, positioned upstream of the focusing lens, to deflect during the first pass the laser beam in a second travel direction transverse to first travel direction to process at least a second target semiconductor link in either the second link row or the third link row.

5. The method of claim 4 in which semiconductor links in the first, second, and third link rows are generally arranged in columns, including first and second adjacent columns, and in which the first and second target semiconductor links are located in the first and second columns.

6. The method of claim 4 in which a total number of link rows each contain target semiconductor links, and in which the focusing lens is scanned in the direction generally parallel to the first row a number of times that is fewer than the total number of link rows to process all the target semiconductor links.

7. The method of claim 4 in which semiconductor links in the first, second, and third link rows are generally arranged in columns, including a first column, second and third columns that are adjacent to the first column, and at least one fourth column that is nonadjacent to the first column, and in which the first and second target semiconductor links are located in the first and fourth columns.

8. The method of claim 4 in which the relative motion of the focusing lens in the parallel direction occurs at a travel speed during nonprocessing periods and at a processing speed during a processing period including a link severing event, the processing speed being slower than the travel speed, and in which at least two target semiconductor links are processed during a single processing period.

9. The method of claim 4 in which the relative motion between the laser beam and the workpiece along the first travel direction is imparted by a motion stage.

10. The method of claim 1 in which the high-speed beam steering device comprises a piezoelectric component.

11. The method of claim 1 in which the high-speed beam steering device comprises a electrostrictive actuator.

12. The method of claim 1 in which the high-speed beam steering device employs a voice coil actuator.

13. The method of claim 1 in which the high-speed beam steering system has a maximum beam axis deflection range of 50 microns at the workpiece.

14. The method of claim 1 in which the high-speed beam steering device has a maximum beam axis deflection range of 20 microns at the workpiece.

15. The method of claim 1, further comprising:
    employing a calibration procedure to characterize movement of the laser beam by the high-speed beam steering device prior to processing a target location.

16. The method of claim 1, further comprising:
employing a command generator to generate control signals of a motion stage and the high-speed beam steering device.

17. The method of claim 1 in which an error signal conveys correction information concerning a laser beam quality metric that is affected by a disturbance of the laser beam alignment.

18. The method of claim 1 in which an error signal conveys correction information concerning an environmental condition, a fluctuation of which alters the laser beam alignment.

19. The method of claim 1 in which a pair of galvanometer-driven mirrors is employed to position the laser beam relative to the workpiece, the pair of galvanometer-driven mirrors being distinct from the high-speed beam steering device.

20. The method of claim 19 in which the high-speed beam steering device comprises a piezoelectric component.

21. The method of claim 1, in which positioning the workpiece is carried out at a servo cycle rate, and positioning the high-speed beam steering device is carried out at an updating rate that is substantially greater than the servo cycle rate.

22. The method of claim 1, in which the one or more error signals conform to a first coordinate system and the motion of the high-speed beam steering device is characterized with reference to a second coordinate system, and in which the method further includes transforming at least one of the error signals into the second coordinate system.

23. The method of claim 1 in which the laser beam position errors include linear stage ringing errors.

24. The method of claim 1 in which the laser beam position errors include an AOM-related error.

25. The method of claim 1 in which the laser beam is deflected in two axes in response to the position correction signal to provide an undistorted focused beam spot at the workpiece.

* * * * *